(12) United States Patent
Tanaka et al.

(10) Patent No.: US 12,125,702 B2
(45) Date of Patent: Oct. 22, 2024

(54) SEMICONDUCTOR LIGHT-EMITTING ELEMENT AND METHOD OF PRODUCING THE SAME

(71) Applicant: DOWA Electronics Materials Co., Ltd., Tokyo (JP)

(72) Inventors: Osamu Tanaka, Akita (JP); Yoshitaka Kadowaki, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 366 days.

(21) Appl. No.: 17/754,773

(22) PCT Filed: Oct. 13, 2020

(86) PCT No.: PCT/JP2020/038679
§ 371 (c)(1),
(2) Date: Apr. 12, 2022

(87) PCT Pub. No.: WO2021/075439
PCT Pub. Date: Apr. 22, 2021

(65) Prior Publication Data
US 2023/0155061 A1    May 18, 2023

(30) Foreign Application Priority Data

Oct. 15, 2019    (JP) ................................ 2019-188846
Oct. 12, 2020    (JP) ................................ 2020-172215

(51) Int. Cl.
*H01L 21/02*      (2006.01)
*H01L 33/00*      (2010.01)
(Continued)

(52) U.S. Cl.
CPC .... *H01L 21/02395* (2013.01); *H01L 21/0243* (2013.01); *H01L 21/02461* (2013.01);
(Continued)

(58) Field of Classification Search
None
See application file for complete search history.

(56) References Cited

U.S. PATENT DOCUMENTS 6,108,360 A    8/2000   Razeghi
8,071,992 B2 *   12/2011   Kitano ................. H01L 33/405
                                                                                              257/98
(Continued)

FOREIGN PATENT DOCUMENTS

CN      103155182 A    6/2013
CN      110088921 A    8/2019
(Continued)

OTHER PUBLICATIONS

English translation of KR 101633871 B1 (Year: 2016).*
(Continued)

*Primary Examiner* — Khaja Ahmad
(74) *Attorney, Agent, or Firm* — KENJA IP LAW PC

(57) ABSTRACT

Provided is a semiconductor light-emitting element that exhibits a light emission spectrum in which a single peak is obtained by controlling multi peaks. In the semiconductor light-emitting element having a second conductivity type cladding layer on the light extraction side, the arithmetic mean roughness Ra of a surface of the light extraction surface of the second conductivity type cladding layer is 0.07 μm or more and 0.7 μm or less, and the skewness Rsk of the surface is a positive value.

5 Claims, 11 Drawing Sheets

(51) Int. Cl.
  *H01L 33/10* (2010.01)
  *H01L 33/22* (2010.01)
  *H01L 33/30* (2010.01)
(52) U.S. Cl.
  CPC .. *H01L 21/02463* (2013.01); *H01L 21/02466* (2013.01); *H01L 21/02543* (2013.01); *H01L 21/02546* (2013.01); *H01L 21/02549* (2013.01); *H01L 21/0262* (2013.01); *H01L 21/02658* (2013.01); *H01L 33/0062* (2013.01); *H01L 33/10* (2013.01); *H01L 33/22* (2013.01); *H01L 33/305* (2013.01); *H01L 33/0093* (2020.05)

(56) References Cited

U.S. PATENT DOCUMENTS

| | | | |
|---|---|---|---|
| 2012/0037949 A1* | 2/2012 | Jeong | H01L 33/405 |
| | | | 257/E33.062 |
| 2014/0166975 A1* | 6/2014 | Ito | H01L 33/06 |
| | | | 257/13 |
| 2016/0233376 A1* | 8/2016 | Lin | H01L 33/06 |
| 2016/0276528 A1* | 9/2016 | Kizhaev | H01L 21/02455 |
| 2017/0012171 A1* | 1/2017 | Ko | H01L 33/06 |
| 2019/0148591 A1* | 5/2019 | Huang | H01L 33/025 |
| | | | 257/101 |
| 2020/0020828 A1* | 1/2020 | Yamamoto | H01L 33/405 |

FOREIGN PATENT DOCUMENTS

| | | |
|---|---|---|
| JP | 2000349331 A | 12/2000 |
| JP | 2002353500 A | 12/2002 |
| JP | 2009032866 A | 2/2009 |
| JP | 2015534270 A | 11/2015 |
| JP | 6648329 B2 | 2/2020 |
| KR | 101633871 B1 | 6/2016 |
| TW | 201830729 A | 8/2018 |
| WO | WO-2018116995 A1 * 6/2018 ......... H01L 33/0062 |
| WO | 2018198982 A1 | 11/2018 |

OTHER PUBLICATIONS

English translation of WO 2018116995 A1 (Year: 2018).*
Jan. 30, 2023, Office Action issued by the Taiwan Intellectual Property Office in the corresponding Taiwanese Patent Application No. 109135536.
Dec. 22, 2020, International Search Report issued in the International Patent Application No. PCT/JP2020/038679.
Dec. 22, 2020, Notification of Reasons for Refusal issued by the Japan Patent Office in the corresponding Japanese Patent Application No. 2020-172215.
Jul. 30, 2021, Office Action issued by the Taiwan Intellectual Property Office in the corresponding Taiwanese Patent Application No. 109135536.
Mar. 4, 2022, Office Action issued by the Taiwan Intellectual Property Office in the corresponding Taiwanese Patent Application No. 109135536.
Apr. 19, 2022, International Preliminary Report on Patentability issued in the International Patent Application No. PCT/JP2020/038679.
Aug. 30, 2024, Office Action issued by the China National Intellectual Property Administration in the corresponding Chinese Patent Application No. 202080072698.1.

* cited by examiner

Example 1

Comparative Example 1

Comparative Example 2

Example 1

10 μm

Example 2

10 μm

Comparative
Example 2

Example 1

Comparative
Example 1

Comparative
Example 2

SEMICONDUCTOR LIGHT-EMITTING ELEMENT AND METHOD OF PRODUCING THE SAME

TECHNICAL FIELD

This disclosure relates to a semiconductor light-emitting element and particularly relates to a method of producing an infrared emission semiconductor light-emitting element.

BACKGROUND

Conventionally, mid-infrared emission semiconductor light-emitting elements which emit light with wavelengths of 3400 nm or more in the infrared region are known. For example, mid-infrared emission semiconductor light-emitting elements are widely used in the applications such as sensors and gas analysis.

When the emission wavelengths of such a semiconductor light-emitting element are 3400 nm to 4500 nm in the mid-infrared region, typically, InAsSb-based III-V semiconductors including In, As, and Sb are used in its light emitting layer. Conventionally, when an InAsSb-based III-V semiconductor layer such as an InAsSb layer is epitaxially grown, an InAs substrate is used as a growth substrate so that the growth substrate and the InAsSb-based III-V semiconductor layer containing In and As are lattice matched.

For example, in JP 2015-534270 A (PTL 1), for example, after an InSbP layer is formed on an InAs substrate, an InAsSbP active layer is formed. In PTL 1, a conductive InAs substrate is used as is for wavelengths of 2.6 μm to 4.7 μm in a light-emitting diode.

CITATION LIST

Patent Literature

PTL 1: JP 2015-534270 A

SUMMARY

Technical Problem

In recent years, semiconductor optical devices are required to have further improved properties such as improved efficiency of light-emitting elements and improved sensitivity of light-receiving elements. The present inventors previously attempted to develop a bonded semiconductor optical device obtained by growing an InAsSbP-based III-V compound semiconductor containing at east In and As on an etching stop layer made of a GaAsSb-based III-V compound semiconductor containing at least Ga and Sb, the etching stop layer being grown on an InAs growth substrate; bonding a support substrate to the etching stop layer with a metal bonding layer therebetween; and removing the growth substrate. They thus succeeded in increasing the light output power compared with conventional non-bonded devices. However, the present inventors newly found that for this bonded semiconductor light-emitting diode, a light emission spectrum where the horizontal axis represents the wavelength and the vertical axis represents the emission intensity has a plurality of emission peaks other than the emission peak having the maximum emission intensity at the center emission wavelength (hereinafter referred to as "multi peaks"). An emission peak (hereinafter may also simply described as a "peak") herein refers to a point in a light emission spectrum measured when the wavelength intervals on the horizontal axis are 15 nm or less, which has the maximal value when the slope of change on the vertical axis (emission intensity) with respect to change on the horizontal axis (wavelength) is 0. Further, the above peak excludes any peak having a relative intensity of less than 0.1 with respect to the emission intensity of the emission peak at the center emission wavelength.

Note that in the case of a non-bonded semiconductor light-emitting diode using conventional techniques, the light emission spectrum typically does not have any peak other than the emission peak at the center emission wavelength (only the emission peak at the center emission wavelength is found and is herein referred to as a "single peak"); however, when such a diode has a reflective layer, there is also concern about multi peaks. A semiconductor light-emitting element that emits radiation having multi peaks has emission peaks having a relative intensity of 0.1 or more at different wavelengths with respect to the emission intensity of the emission peak at the center emission wavelength, so that when such a semiconductor light-emitting element is used in applications such as a sensor, malfunctions would occur.

It could therefore be helpful to provide a semiconductor light-emitting element including a cladding layer made of an InAsSbP-based III-V compound semiconductor containing at least In and As that exhibits a light emission spectrum in which a single peak is obtained by controlling multi peaks, and to provide a method of producing the semiconductor light-emitting element.

Solution to Problem

The present inventors have diligently studied ways to solve the above problems. When infrared light with wavelengths of 3400 nm to 4500 nm emitted from a light emitting layer is incident on a cladding layer on the light extraction side, if the cladding layer is InAs, the refractive index of InAs for infrared light is approximately 3.5, thus when light is directly extracted from the cladding layer to the atmosphere (refractive index: 1), most of light obliquely incident on an interface is considered to be reflected back into semiconductor layers. On the other hand, in a semiconductor light-emitting element having a reflective layer between a light emitting layer and a substrate, infrared light emitted from the light emitting layer in the direction of the substrate is reflected off the reflective layer, and the light reflected due to the reflection enters a cladding layer on the above light extraction side through the light emitting layer. Here, the total thickness of the semiconductor layers in the semiconductor light-emitting element is around several micrometers to 15 μm, which is in the range of the coherence length of infrared light, and is likely to cause interference. Note that the coherence length of light with a center emission wavelength of 4150 nm and a half width of 1100 nm is 15.7 μm, whereas the coherence length of light with a center emission wavelength of 4500 nm and a half width of 1100 nm is 18.4 μm. For these reasons, the present inventors considered that since the above light reflected off the interface and the above light reflected off the interface of the cladding layer on the light extraction side interfere, multi peaks are observed in the light emission spectrum. Further, this phenomenon would also occur in the case where light is extracted from the cladding layer to the atmosphere through a protective layer made of a dielectric having a lower refractive index than InAs. To address this problem, the present inventors contemplated roughening a surface of a light extraction surface of the cladding layer, and found that multi peaks can be eliminated by the surface roughening. This led to this disclosure.

Specifically, this disclosure provides the following features.

(1) A semiconductor light-emitting element comprising:
a substrate;
a reflective layer on the substrate;
a first conductivity type cladding layer made of an InAsSbP-based III-V compound semiconductor containing at least In and As on the reflective layer;
an active layer with a center emission wavelength of 3400 nm or more and 4500 nm or less on the first conductivity type cladding layer; and
a second conductivity type cladding layer made of an InAsSbP-based III-V compound semiconductor containing at least In and As on the active layer,
wherein the second conductivity type cladding layer is on the light extraction side, and
an arithmetic average roughness Ra of a surface of a light extraction surface of the second conductivity type cladding layer is 0.07 μm or more and 0.7 μm or less, and a skewness Rsk of the surface is a positive value.

(2) A semiconductor light-emitting element comprising:
a support substrate;
a metal bonding layer on the support substrate;
a reflective layer on the metal bonding layer;
a first conductivity type cladding layer made of an InAsSbP-based III-V compound semiconductor containing at least In and As on the reflective layer;
an active layer with a center emission wavelength of 3400 nm or more and 4500 nm or less on the first conductivity type cladding layer; and
a second conductivity type cladding layer made of an InAsSbP-based III-V compound semiconductor containing at least In and As on the active layer,
wherein the second conductivity type cladding layer is on the light extraction side, and
an arithmetic average roughness Ra of a surface of a light extraction surface of the second conductivity type cladding layer is 0.07 μm or more and 0.7 μm or less, and a skewness Rsk of the surface is a positive value.

(3) The semiconductor light-emitting element according to (1) or (2) above, wherein a light emission spectrum of light obtained from the light extraction surface has a single peak.

(4) The semiconductor light-emitting element according to any one of (1) to (3) above, wherein the arithmetic average roughness Ra of the surface of the light extraction surface is 0.1 μm or more and 0.4 μm or less, and the skewness Rsk of the surface is 0.1 or more and 0.7 or less.

(5) The semiconductor light-emitting element according to any one of (1) to (4) above, wherein a protective film is provided on the light extraction surface.

(6) A method of producing a semiconductor light-emitting element, the method comprising:
a first step of sequentially forming a reflective layer, a first conductivity type cladding layer made of an InAsSbP-based III-V compound semiconductor containing at least In and As, an active layer with a center emission wavelength of 3400 nm or more and 4500 nm or less, and a second conductivity type cladding layer made of an InAsSbP-based III-V compound semiconductor containing at least In and As, on a substrate; and
a second step of performing surface roughening so that an arithmetic average roughness Ra of a surface of a light extraction surface of the second conductivity type cladding layer is 0.07 μm or more and 0.7 μm or less, and a skewness Rsk of the surface is a positive value.

(7) The method of producing a semiconductor light-emitting element, according to (6) above, wherein in the second step, the surface roughening is performed so that the arithmetic average roughness Ra of the surface of the light extraction surface is 0.1 μm or more and 0.4 μm or less, and the skewness Rsk of the surface is 0.1 or more and 0.7 or less.

(8) A method of producing a semiconductor light-emitting element, the method comprising:
a semiconductor layer formation step of sequentially forming an etching stop layer made of a GaAsSb-based III-V semiconductor containing at least Ga and Sb, a second conductivity type cladding layer made of an InAsSbP-based III-V compound semiconductor containing at least In and As, an active layer with a center emission wavelength of 3400 nm or more and 4500 nm or less, and a first conductivity type cladding layer made of an InAsSbP-based III-V compound semiconductor containing at least In and As, on a growth substrate;
a reflective layer formation step of forming a reflective layer that reflects light emitted from the semiconductor active layer on the first conductivity type cladding layer;
a bonding step of bonding the reflective layer to the support substrate with at least a metal bonding layer therebetween;
a substrate removal step of removing the growth substrate; and
a surface roughening step of performing roughening so that an arithmetic average roughness Ra of a surface of a light extraction surface of the second conductivity type cladding layer is 0.07 μm or more and 0.7 μm or less, and a skewness Rsk of the surface is a positive value.

(9) The method of producing a semiconductor light-emitting element, according to (8) above, wherein in the surface roughening step, the surface roughening is performed so that the arithmetic average roughness Ra of the surface of the light extraction surface is 0.1 μm or more and 0.4 μm or less, and the skewness Rsk of the surface is 0.1 or more and 0.7 or less.

(10) The method of producing a semiconductor light-emitting element, according to (8) or (9) above, the further comprising a top electrode formation step of forming a second conductivity type electrode on a top electrode formation region in the second conductivity type cladding layer excluding the light extraction surface with the III-V semiconductor etching stop layer therebetween.

(11) A method of producing a semiconductor light-emitting element, the method comprising:
a first step of sequentially forming a reflective layer, a first conductivity type cladding layer made of an InAsSbP-based III-V compound semiconductor containing at least In and As, an active layer with a center emission wavelength of 3400 nm or more and 4500 nm or less, and a second conductivity type cladding layer made of an InAsSbP-based III-V compound semiconductor containing at least In and As, on a substrate; and
a second step of performing surface roughening on a light extraction surface of the second conductivity type cladding layer using nitric acid.

(12) The method of producing a semiconductor light-emitting element, according to (11) above, wherein the nitric acid uses nitric acid with a concentration of 11 M (mol/L) to 20 M (mol/L).

Advantageous Effect

This disclosure can provide a semiconductor light-emitting element including a cladding layer made of an InAsSbP-based III-V compound semiconductor containing at least In and As that exhibits a light emission spectrum in which a single peak is obtained by controlling multi peaks, and to provide a method of producing the semiconductor light-emitting element.

BRIEF DESCRIPTION OF THE DRAWINGS

In the accompanying drawings.

DETAILED DESCRIPTION

Figure 1:
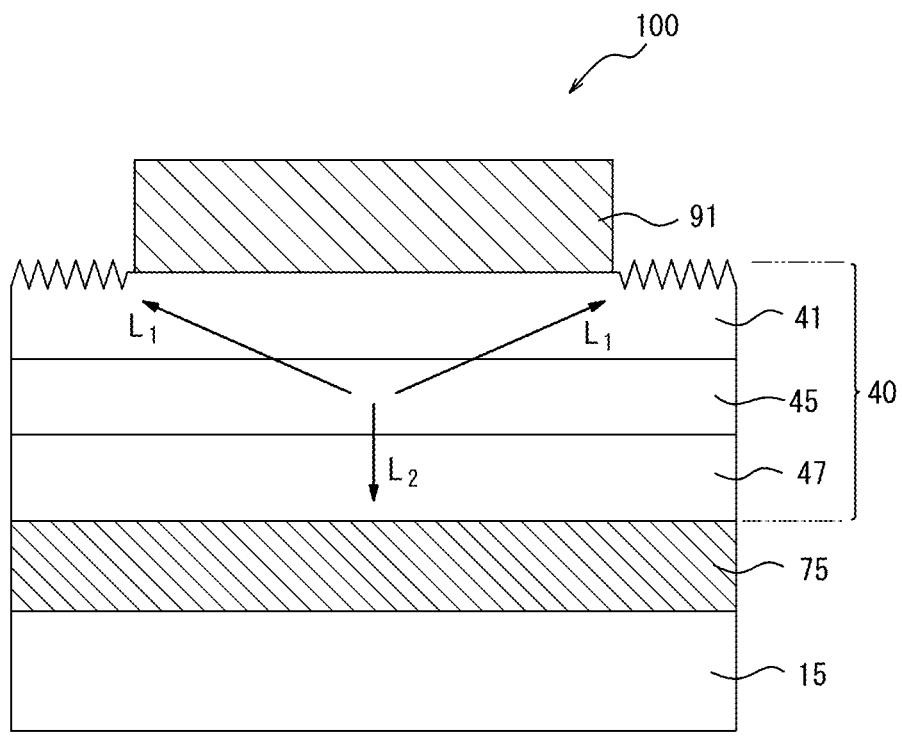
FIG. 1 is a schematic cross-sectional view of an example of a semiconductor light-emitting element of this disclosure.

Prior to describing embodiments of this disclosure, the following points are described beforehand.

Composition

First, in this specification, the expression "AlInGaAsSbP" alone for which the III-V compound composition ratio is not specified means a given compound having a chemical composition ratio of group III elements (Al, In, and Ga in total) with respect to group V elements (As, Sb, and P) of 1:1, in which the ratio between Al, In, and Ga that are group III elements and the ratio between As, Sb, and P that are group V elements are undefined. In this case, there may be a possibility that one or two elements of Al, In, and Ga are not contained as the group III elements; and there may be a possibility that one or two of As, Sb, and P are not contained as the group V elements. However, when a compound is explicitly described to "contain at least" either or both of specific group III elements and specific group V elements, the subject group III elements or group V elements are each contained at more than 0% and 100% or less. For example, AlInGaAsSbP "containing at least In and Sb" contains more than 0% and 100% or less of each of In and Sb. In this case, Al and Ga, and As and P other than In and Sb may or may not be contained. Further, an AlInGaAsSbP "-based" III-V compound semiconductor may contain a given dopant. Note that the chemical composition ratio between the group III-V elements of AlInGaAsSbP can be found for example by a photoluminescence measurement or an X-ray diffraction measurement.

On the other hand, when specific group III elements or group V elements are excluded from "AlInGaAsSbP", the subject group III elements or group V elements are not contained in the composition. For example, the composition of "InAsSbP" is represented by a general formula: $InAs_xSb_yP_z$, and does not contain Al and Ga. In this case, for the composition ratio between the elements, the following relationships hold, and the composition ratios of the group V elements is 1 in total. Meanwhile, the total of the composition ratios of the group III elements is also 1.

$z=1-x-y, 0 \leq x \leq 1, 0 \leq y \leq 1, 0 \leq z \leq 1$

P-Type, N-Type, and Dopant Concentration

In this specification, a layer serving as an electrically p-type layer is referred to as, for example, a p-type semiconductor layer (may be simply referred to as a "p-type" layer), and a layer serving as an electrically n-type layer is referred to as, for example, an n-type semiconductor layer (may be simply referred to as an "n-type" layer). On the other hand, a layer that is not deliberately doped with certain impurities such as Si, Zn, S, Sn, Mg, and Te is described as being "undoped". An undoped III-V compound semiconductor layer may contain impurities that are unavoidably mixed in the production process. Specifically, when a layer has a low dopant concentration (for example, less than $5 \times 10^{16}$ atoms/cm$^3$), the layer is treated as being "undoped" in this specification. Further, a III-V compound semiconductor layer that is not deliberately doped with impurities but contains $5 \times 10^{16}$ atoms/cm$^3$ or more unavoidable impurities (such as O, C, or H) associated with decomposition of a source gas in the production process is also treated as being undoped. It should be noted that since InAs serves as an electricity n-type semiconductor even when being undoped, either an undoped InAs layer or an n-type InAs layer is an InAs layer serving as an n-type layer. Further, the values of the impurity concentrations of Si, Zn, S, Sn, Mg, Te, etc. are determined by SIMS analysis. Note that since the value of the dopant concentration greatly varies in the vicinity of the boundaries between semiconductor layers, the value of the dopant concentration is found as the value of the dopant concentration at the center in the thickness direction of each layer.

Thickness and Composition of Layers

Further, the total thickness of the layers formed can be found by observing a cross section of the layers using a scanning electron microscope or a transmission electron microscope. Moreover, the thickness of each layer can be found by observing a cross section of the grown layer using a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Surface Roughness Ra and Skewness Rsk

A surface roughness Ra herein means an arithmetic mean roughness (μm) over a measurement distance. Further, a skewness Rsk is a value indicating the symmetry between peaks and troughs about the mean line. When Rsk is zero, the curve is horizontally symmetric about the mean line (normal distribution), and a positive Rsk indicates that a given distribution is biased downward (to the trough side) below the mean line, whereas a negative Rsk indicates that a given distribution is biased upward (to the peak side) above the mean line. The definitions of the surface roughness Ra and the skewness Rsk conform to ISO 4287-1997. Further, a surface roughness Sa used herein is a value representing the arithmetic mean roughness (μm) as well as the above surface roughness Ra and conforms to ISO 25178. Moreover, a skewness Ssk is a value representing the symmetry between peaks and troughs about the mean line as well as the above skewness Rsk and conforms to ISO 25178. Whereas the surface roughness Ra and the skewness Rsk are measured values obtained by the two-dimensional profile method according to ISO 4287-1997, the surface roughness Sa and the skewness Ssk are values measured for a three-dimensional surface profile according to ISO 25178. In a method of measuring the surface roughness Ra and the skewness Rsk, the measurement can be performed using a contact stylus step profilometer (for example, a contact stylus profiler "P-6" manufactured by KLA-Tencor Corporation). The shape of the probe used may have a stylus tip radius of 2 μm, the stylus contact force may be 2 mg, the scanning rate may be 2 μm/s, and the sampling frequency may be 50 Hz. The measurement distance (reference length) is set to 200 μm. Further, in a method of measuring the surface roughness Sa and the skewness Ssk, the measurement can be performed using a non-contact stylus laser microscope for shape analysis (VK-X1000/1100 manufactured by KEYENCE CORPORATION). In the measurement conditions in Examples (Experimental Example 2) in this specification, the lens magnification was 150x, and the number of pixels was 2048×1536.

Random Rough Surface

Further, a "random rough surface" herein refers to a surface having nonperiodic irregularities that for example excludes a surface on the light extraction side, in which a shape including periodic grooves is observed, and the surface roughness Ra of an area where the grooves are not formed is 0.010 μm or less in a result of measurement using the above contact stylus profilometer. When the "random rough surface" is on the light extraction side, a single peak that is an advantage of this disclosure can be more reliably obtained in any area in the in-plane direction, and since the method of forming a random rough surface is simpler than that for a periodic rough surface, a random rough surface is preferred.

Semiconductor Light-Emitting Element 100

An example of an embodiment of a semiconductor light-emitting element of this disclosure is described with reference to FIG. 1. A semiconductor light-emitting element 100 includes a substrate 15, a reflective layer 75 on the substrate 15, a first conductivity type cladding layer 47 made of an InAsSbP-based III-V compound semiconductor containing at least In and As on the reflective layer 75, an active layer 45 with a center emission wavelength of 3400 nm or more and 4500 nm or less on the first conductivity type cladding layer 47, and a second conductivity type cladding layer 41 made of an InAsSbP-based III-V compound semiconductor containing at least In and As on the active layer 45; and the second conductivity type cladding layer 41 is on the light extraction side. A surface of a light extraction surface of the second conductivity type cladding layer 41 is a rough surface, its arithmetic mean roughness Ra is 0.07 μm or more and 0.7 μm or less, and the skewness Rsk of the surface is a positive value.

The details of the components of the semiconductor light-emitting element 100 will be described below through the description of a semiconductor light-emitting element 200 to be described with reference to FIG. 2 to FIG. 7, referring to the components denoted by numerals having the same two digits as the above components. Note that when a bonding technique to be described is used in the method of producing the semiconductor light-emitting element 200, the substrate 15 may use a support substrate 80, and when the bonding technique is not used, a growth substrate 10 may be used to epitaxially grow the semiconductor layers. When the above bonding technique is used, the reflective layer 75 may use a reflective layer 71 that is for example a metal reflective layer, and when the bonding technique is not used, a DBR (distributed Bragg reflector) semiconductor reflective layer may be used. Note that in the semiconductor light-emitting element 100, a top electrode 91 including a pad portion and a distribution portion (corresponding to an n-type electrode 91 in the semiconductor light-emitting element 200) may be formed on the second conductivity type cladding layer 41, and a bottom electrode may also be formed on the rear surface of the support substrate (the bottom electrode is not illustrated). Further, the second conductivity type cladding layer 41 may further include a layer that is called a contact layer and is for reducing the resistance on the top electrode side, and in this disclosure, the cladding layer and the contact layer are not distinguished and are collectively referred to as a cladding layer. When the reflective layer 75 is a metal reflective layer, the first conductivity type cladding layer 47 may also include a contact layer on the reflective layer 75 side.

Here, as illustrated in FIG. 1, in the semiconductor light-emitting element 100, light emitted from the active layer 45 roughly falls into light $L_1$ toward the second conductivity type cladding layer 41 and light $L_2$ toward the first conductivity type cladding layer 47. In FIG. 1, an area of the surface of the second conductivity type cladding layer 41 through which $L_1$ and $L_2$ reflected off the reflective layer 75 are emitted to the outside (mainly the atmosphere), excluding an area on which the top electrode 91 is formed, is referred to as a "light extraction surface". Namely, a "light extraction surface" refers to a surface on which the top electrode is formed (upper surface), and light is emitted to the outside through the surface as illustrated in FIG. 1. Note that light is also extracted from the side surfaces of the semiconductor light-emitting element 100. However, since light extraction from the side surfaces has little effect on the formation of multi peaks, the side surfaces may or may not be roughened. Note however that in terms of enhancing the light output power, the side surfaces are also preferably roughened.

In the semiconductor light-emitting element 100, the "light extraction surface" of the second conductivity type cladding layer 41 has a rough surface. The arithmetic mean roughness Ra of the surface of the light extraction surface is 0.07 µm or more and 0.7 µm or less and the skewness Rsk of the surface is a positive value; preferably, the arithmetic mean roughness Ra is 0.1 µm or more and 0.4 µm or less and the skewness Rsk of the surface is 0.1 or more and 0.7 or less. Further, as illustrated in FIG. 1, the top electrode 91 is provided on a flat portion of the surface of the second conductivity type cladding layer 41.

Experiments by the present inventors demonstrated that even if the skewness Rsk is positive, when the depth of the irregularities is small and the surface roughness Ra is less than 0.07 µm, a single peak cannot be obtained. Accordingly, when the surface roughness Ra is 0.07 µm or more, preferably 0.1 µm or more, light with a single peak can be obtained. The upper limit of the surface roughness is preferably 0.7 µm or less, more preferably 0.4 µm or less. An excessively high surface roughness would adversely affect the spread of currents in the transverse direction. Further, even when the surface roughness Ra is 0.07 µm or more, when the skewness Rsk is negative and many flat surfaces or nearly flat portions are formed on the tops of the irregularities on the light extraction side, it was found that the number of multi peaks in a light emission spectrum cannot be reduced and a single peak cannot be obtained. Accordingly, the skewness Rsk is positive (i.e., Rsk>0), and preferably satisfies 0.1≤Rsk≤0.7. In order to increase the light output power, the surface roughness Ra is more preferably 0.25 µm or more.

Note that the upper limit of the surface roughness Ra is at least smaller than the thickness of the second conductivity type cladding layer to be roughened, and is for example 2 µm. The upper limit of the skewness Rsk suitable for reducing the number of multi peaks while increasing the light emission efficiency is, for example, 0.7. Further, for the same reason as the above, the surface roughness Sa of the surface of the light extraction surface is preferably 0.05 µm or more, more preferably 0.1 µm or more. The upper limit is preferably 0.7 µm or less. Further, the skewness Ssk of the surface of the light extraction surface is preferably −0.5 or more, and is preferably 0.7 or less. In order to increase the light output power, the surface roughness Sa is more preferably 0.25 µm or more.

When the conductivity type of the first conductivity type cladding layer 47 is n-type, the second conductivity type cladding layer 41 is p-type. Conversely, when the conductivity type of the first conductivity type cladding layer 47 is p-type, the second conductivity type cladding layer 41 is n-type.

Subsequently, an example of a method of producing a semiconductor light-emitting element, according to this disclosure will be described along with the details of the components. A method of producing a semiconductor light-emitting element, according to this disclosure has at least a semiconductor layer formation step, a reflective layer formation step, a bonding step, a substrate removal step, and a surface roughening step, which are described below.

Figure 2:
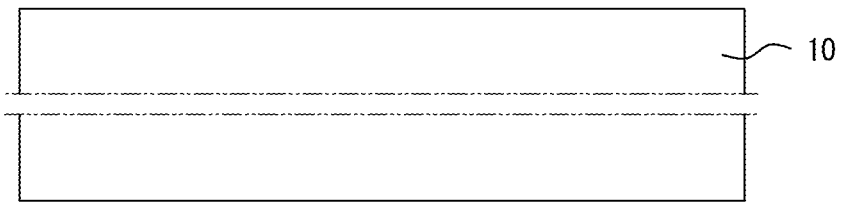
FIG. 2 is a schematic cross-sectional view illustrating an example of a production process of a semiconductor light-emitting element, according to this disclosure.
Figure 2:
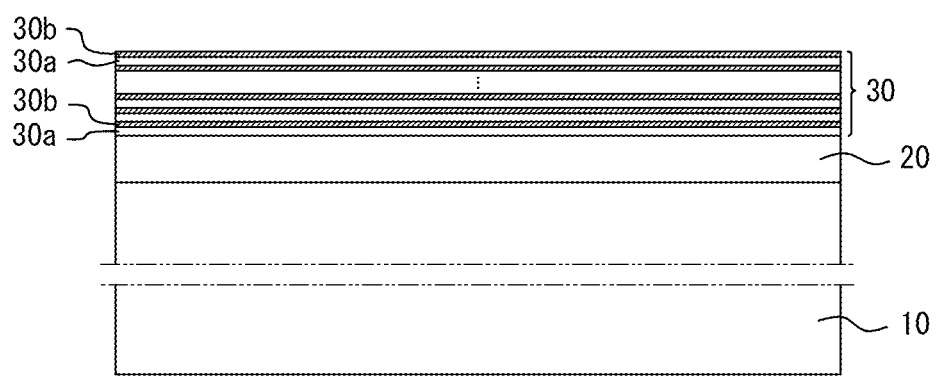
Figure 2:
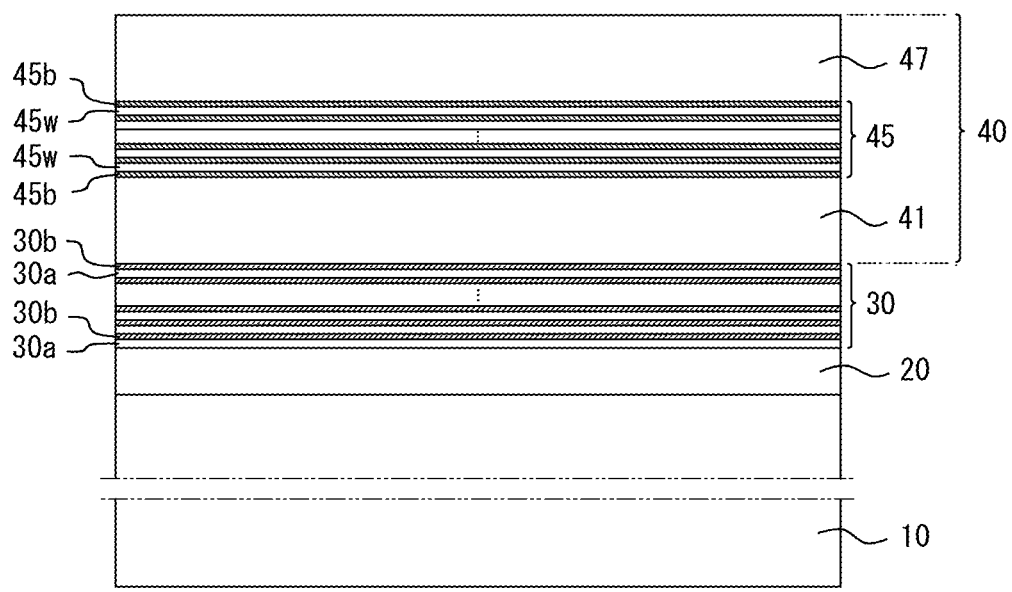

Referring to S10 to S30 in FIG. 2, in the above semiconductor layer formation step, an etching stop layer 30 made of a GaAsSb-based III-V semiconductor containing at least Ga and Sb, a second conductivity type cladding layer 41 made of an InAsSbP-based III-V compound semiconductor containing at least In and As, an active layer 45 with a center emission wavelength of 3400 nm or more and 4500 nm or less, and a first conductivity type cladding layer 47 made of an InAsSbP-based III-V compound semiconductor containing at least In and As are sequentially formed on a growth substrate 10. Referring to S70 in FIG. 4, in the above reflective layer formation step, a reflective layer 71 that reflects light emitted from the active layer 45 is formed on the first conductivity type cladding layer 47. Referring to S80 in FIG. 5, in the above bonding step, the reflective layer 71 is bonded to the support substrate 80 with at least a metal bonding layer 79 therebetween. Referring to S90 in FIG. 5, in the above substrate removal step, the growth substrate is removed. Further, referring to S120 in FIG. 7, in the surface roughening step, after the substrate removal step, surface roughening is performed so that the arithmetic mean roughness Ra of the surface of the light extraction surface of the second conductivity type cladding layer 41 is 0.07 µm or more and 0.7 µm or less and the skewness Rsk thereof is a positive value.

Figure 6:
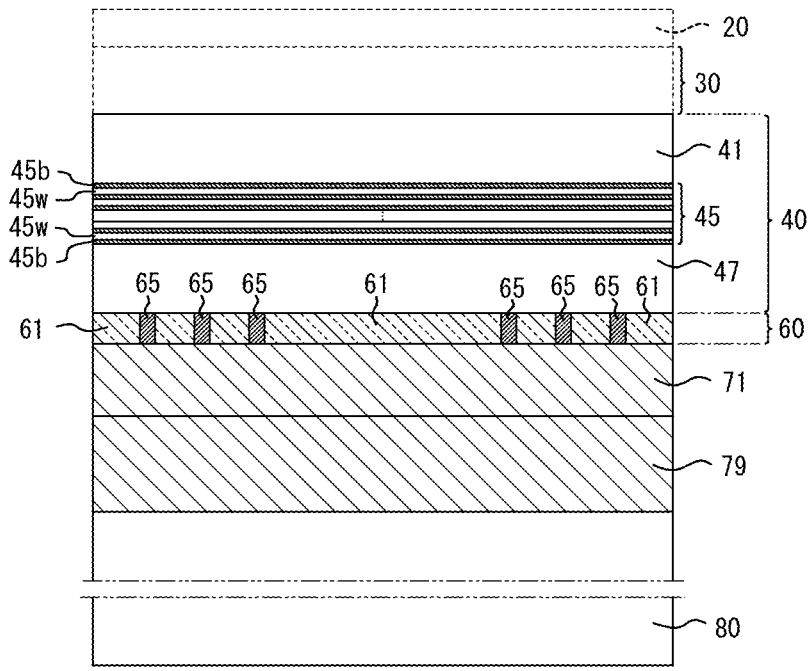
FIG. 6 is a schematic cross-sectional view illustrating steps of the example of a production process of a semiconductor light-emitting element of this disclosure, subsequent to the steps in FIG. 5.
Figure 6:
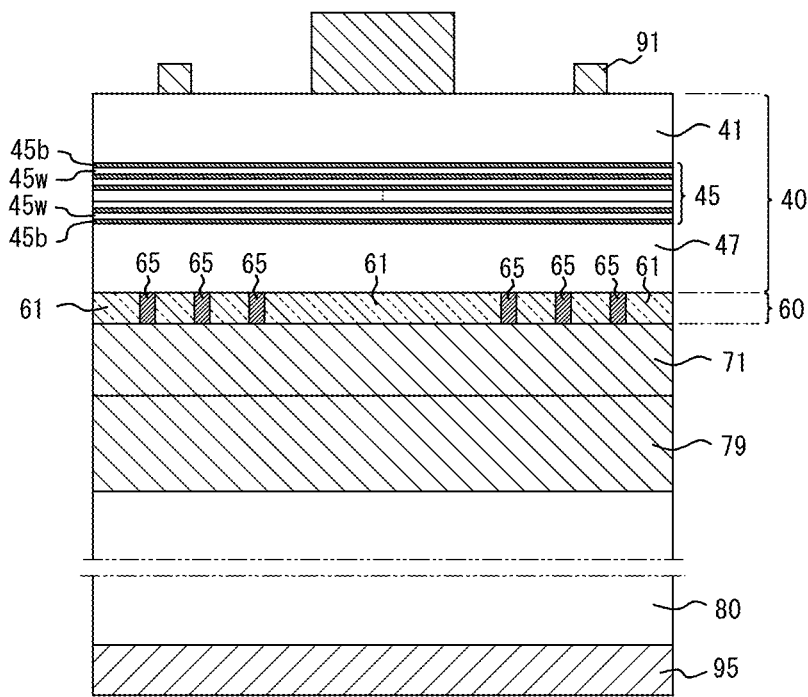

In an example of an embodiment of the production method, additionally, an initial buffer layer 20 may be formed (see S20 in FIG. 2), a distribution portion 60 may be formed (see S40 and S50 in FIGS. 3 and S60 in FIG. 4), the initial buffer layer 20 may be removed (see S100 in FIG. 6), the etching stop layer 30 may be removed (see S100 in the same drawing), and an electrode 95 may be formed (see S110 in FIG. 6). These are optional steps. The steps, including the above optional steps, and the components will now be described in succession.

<Semiconductor Layer Formation Step>

Reference is made to S10 to S30 in FIG. 2. In the semiconductor layer formation step, the initial buffer layer 20 may optionally be formed on the growth substrate 10, and the etching stop layer 30 is formed on the growth substrate 10 with the initial buffer layer 20 therebetween if necessary (S10, S20). Further, the second conductivity type cladding layer 41 made of an InAsSbP-based III-V compound semiconductor containing at least In and As, the active layer 45 with a center emission wavelength of 3400 nm or more and 4500 nm or less, and the first conductivity type cladding layer 47 made of an InAsSbP-based III-V compound semiconductor containing at least In and As are sequentially formed on the etching stop layer 30. Hereinafter, a semiconductor laminate including the second conductivity type cladding layer 41, the active layer 45, and the first conductivity type cladding layer 47 may be referred to as "a semiconductor laminate 40"; further, the second conductivity type cladding layer 41 may be abbreviated as a "n-type cladding layer 41", and the first conductivity type cladding layer 47 may be abbreviated as a "p-type cladding layer 47" for convenience of description.

Growth Substrate

Reference is made to S10 in FIG. 2. The growth substrate 10 may be appropriately selected so that it is lattice matched with the semiconductor composition of the etching stop layer 30. For example, any one of an n-type InAs substrate, an undoped InAs substrate, and a p-type InAs substrate, which are commercially available, may be used as the growth substrate 10.

Etching Stop Layer

Reference is made to S20 to S30 in FIG. 2. The etching stop layer 30 made of a GaAsSb-based III-V semiconductor containing at least Ga and Sb is formed on the growth substrate 10. As described above, before forming the etching stop layer 30, the initial buffer layer 20 may be formed on a surface of the growth substrate 10 (S20 in FIG. 2). In this case, the etching stop layer 30 is formed on the initial buffer layer 20.

Composition of Etching Stop Layer

The composition of the GaAsSb-based III-V compound semiconductor of the etching stop layer 30 is expressed as $GaAs_{xE}Sb_{1-x}E$, where the As composition ratio is $x_E$. The As composition ratio $x_E$ preferably satisfies $0 \leq x_E \leq 0.4$. An As composition ratio $x_E$ of more than 0.4 would allow for etching even with the etchant to be described, and an As composition ratio $x_E$ satisfying the above range allows the etching stop layer 30 to be epitaxially grown on the growth substrate 10 with the etching stop layer 30 being insoluble in the etchant to be described. It is also preferred that the GaAsSb-based III-V compound semiconductor contains at least Ga, As, and Sb. Specifically, the As composition ratio $x_E$ more preferably satisfies $0 < x_E$, still more preferably satisfies $0.02 \leq x_E \leq 0.13$. An As composition ratio $x_E$ within this range can reduce the difference in lattice contact from the growth substrate.

Layer Structure of Etching Stop Layer

Note that the etching stop layer 30 may have a single layer structure or may have a layered structure including a plurality of layers. It is also preferred that the etching stop layer 30 includes a superlattice laminate and the superlattice laminate includes layers containing Ga, As, and Sb. In FIG. 2, the etching stop layer 30 has a superlattice laminate in which first layers 30a and second layers 30b are alternately stacked in this order. For example, even if a single layer having a composition lattice matched with a growth substrate is hardly grown, a superlattice structure having layers with a composition having a larger lattice constant than the growth substrate and a composition having a smaller lattice constant than the growth substrate each with a thickness equal to or less than the critical thickness can compensate strain. When the lattice constant of the average composition of the whole etching stop layer 30 of the superlattice structure is made closer to the lattice constant of the growth substrate, an etching stop layer having good crystallinity and a sufficient thickness can be obtained. Further, when the chemical composition of the first layers 30a is expressed as $GaAs_{xE1}Sb_{1-xE1}$, $0.08 \leq x_{E1} \leq 0.80$ is acceptable, and $0.10 \leq x_{E1} \leq 0.40$ is preferable. Meanwhile, when the chemical composition of the second layers 30b is expressed as $GaAs_{xE2}Sb_{1-xE2}$, $0 \leq x_{E2} \leq 0.08$ is acceptable, and $0 \leq x_{E2} \leq 0.05$ is preferable. Where the thickness of the first layers 30a is expressed as $t_1$ and the thickness of the second layers 30b is expressed as $t_2$, the average composition ratio $x_{E3}$ can be represented as $(x_{E1} \times t_1 + x_{E2} \times t_2)/(t_1+t_2)$. The average composition ratio $x_{E3}$ satisfies $0 \leq x_{E3} \leq 0.4$, preferably satisfies $0.02 \leq x_{E3} \leq 0.13$.

Thickness of Etching Stop Layer

The total thickness of the etching stop layer 30 may be for example, but not limited to, 10 nm to 200 nm. When the etching stop layer 30 includes a superlattice laminate, the thickness of each layer in the laminate may be set to 0.05 nm to 10.0 nm, and the number of pairs of the two different layers can be set to 10 to 200.

Initial Buffer Layer

As described above, the initial buffer layer 20 may be formed on the surface of the growth substrate 10. This can prevent the influence of an oxide film, contamination, etc. on the substrate surface of the growth substrate 10 when the etching stop layer 30 is formed directly on the growth substrate 10. For example, when the initial buffer layer 20 made of InAs is grown on the growth substrate 10 constituted by an InAs substrate, purification of the interface between the etching stop layer 30 and the initial buffer layer 20 can be expected. This is expected to result in the effect of improving the crystallinity of semiconductor layers to be epitaxially grown and stabilizing the surface exposed by removing the growth substrate.

Growth Method

The semiconductor layers can be formed by epitaxial growth, for example by a known thin film deposition technique such as metalorganic chemical vapor deposition (MOCVD), molecular beam epitaxy (MBE), or sputtering. For example, trimethylindium (TMIn) may be used as an In source; trimethylgallium (TMGa) or triethylgallium (TEGa) as a Ga source; arsine ($AsH_3$) or tertiary butyl arsine (TBAs) as an As source; trimethylantimony (TMSb), triethylantimony (TESb), or trisdimethylaminoantimony (TDMASb) as a Sb source; and phosphine ($PH_3$) or tertiary butylphosphine (TBP) as a P source at a predetermined mixing ratio, and these source gases may be subjected to vapor phase epitaxy using a carrier gas to form an InGaAsSbP layer having a desired thickness by adjusting the growth time. Note that the other semiconductor layers to be epitaxially grown may be formed in a similar manner. When the layers are p-type or n-type doped, a dopant source gas as desired can be used in addition. Note that undoped InAs may become a n-type semiconductor, since approximately $1 \times 10^{16}$ atoms/$cm^3$ Te derived from materials may be mixed in, in which case, an n-type InAs layer can be formed using undoped InAs without deliberately performing doping with an n-type dopant. This also applies to the following steps of forming semiconductor layers.

Formation of Semiconductor Laminate

Reference is made to S30 in FIG. 2. The semiconductor laminate 40 including the n-type cladding layer 41, the active layer 45, and the p-type cladding layer 47, mentioned above is formed.

Semiconductor Laminate

The semiconductor laminate 40 may have a double hetero (DH) structure in which the active layer 45 is sandwiched between the n-type cladding layer 41 and the p-type cladding layer 47. In this case, the InAsSbP-based III-V compound semiconductor forming the active layer 45 preferably contains In, As, and Sb. It is also preferred that the active layer 45 has a multiple quantum well (MQW) structure in order to enhance the light output power by reducing crystal defects. The active layer 45 having a multiple quantum-well structure can be formed with a strutre in which well layers 45W and barrier layers 45B are placed alternately and repeatedly. The well layers 45w may be made of InAsSb containing at least In, As, and Sb. Meanwhile, the barrier layers 45b may be made of InAsSbP having a larger band gap than the well layers 45w. The center emission wavelength of the active layer 45 is 3400 nm or more 4500 nm or less, and can be controlled by altering the composition of the active layer 45.

Composition of Active Layer

For example, when the chemical composition of the well layers 45w is expressed as $InAs_{xw}Sb_{1-xw}$, $0.7 \leq xw \leq 1.0$ is acceptable, and $0.8 \leq xw \leq 1.0$ is preferable. Meanwhile, when the chemical composition of the barrier layers 45b is expressed as $InAs_{xb}P_{1-xb}$, $0.5 \leq xb \leq 1$ is acceptable, and $0.8 \leq xb \leq 1$ is preferable. In the case of a quantum well structure, in addition to altering the composition of the InAsP-based III-V compound, adjusting the difference between the composition ratios between the well layers 45w and the barrier layers 45b to add strain in the well layers is also preferred.

Composition of Cladding Layer

The n-type cladding layer 41 and the p-type cladding layer 47 are layers made of an InAsSbP-based III-V compound semiconductor containing at least In and As, and are preferably made of an InAsP-based III-V compound semiconductor. The n-type cladding layer 41 and the p-type cladding layer 47 that do not contain Ga ensure to prevent the cladding layers from being etched when the etching stop layer 30 is removed. Further, n-type InAs is particularly preferably used as the n-type cladding layer 41, and p-type InAs is particularly preferably used as the p-type cladding layer 47.

Thickness of Semiconductor Laminate

The total thickness of the semiconductor laminate 40 may be for example, but not limited to, 2 μm to 10 μm. The thickness of the n-type cladding layer 41 may be for example, but not limited to, 0.5 μm to 5 μm. The thickness of the active layer 45 may be for example, but not limited to, 3 nm to 2000 nm. The thickness of the p-type cladding layer 47 may be for example, but not limited to, 0.1 μm to 5 μm. When the active layer 45 has a quantum well structure, the thickness of the well layers 45W may be 3 nm to 20 nm, and the thickness of the barrier layers 45B may be 5 nm to 50 nm. The number of pairs of the two layers may be 1 to 50.5. Note that it is also preferred that a barrier layer 45b is first formed, and 40 pairs of well layers 45w and barrier layers 45b (thickness: 8 nm) are then stacked in an alternate manner to form 40.5 pairs in total. In this case, both ends of the quantum well structure are barrier layers 45b.

—Other Semiconductor Layers in Semiconductor Laminate—

Although not illustrated, it is also preferred that the semiconductor laminate 40 further has contact layers having a higher dopant concentration than the cladding layers separately on the n-type cladding layer 41 and the p-type cladding layer 47 on the sides opposite to the active layer 45 (that is, the sides where electrodes to be described are formed). Further, the semiconductor laminate 40 may include i-type spacer layers separately between the n-type cladding layer 41 and the active layer 45 and between the active layer 45 and the p-type cladding layer 47. Further, a p-type electron blocking layer may be provided between the active layer 45 and the p-type cladding layer 47.

Distribution Portion Formation Step

After the above semiconductor layer formation step and before the reflective layer formation step to be described in detail, a distribution portion formation step of forming the distribution portion 60 including a transparent insulating layer 61 provided with through holes 61A and an ohmic electrode portions 65 provided in the through holes 61A on the p-type cladding layer 47 (on the contact layer if a contact layer is provided) may optionally be performed. The method of forming the distribution portion 60 is not limited, and there are many options for determining the order of steps. Referring to S40 and S50 in FIGS. 3 and S60 in FIG. 4, a specific manner of forming the distribution portion 60 is described.

Figure 3:
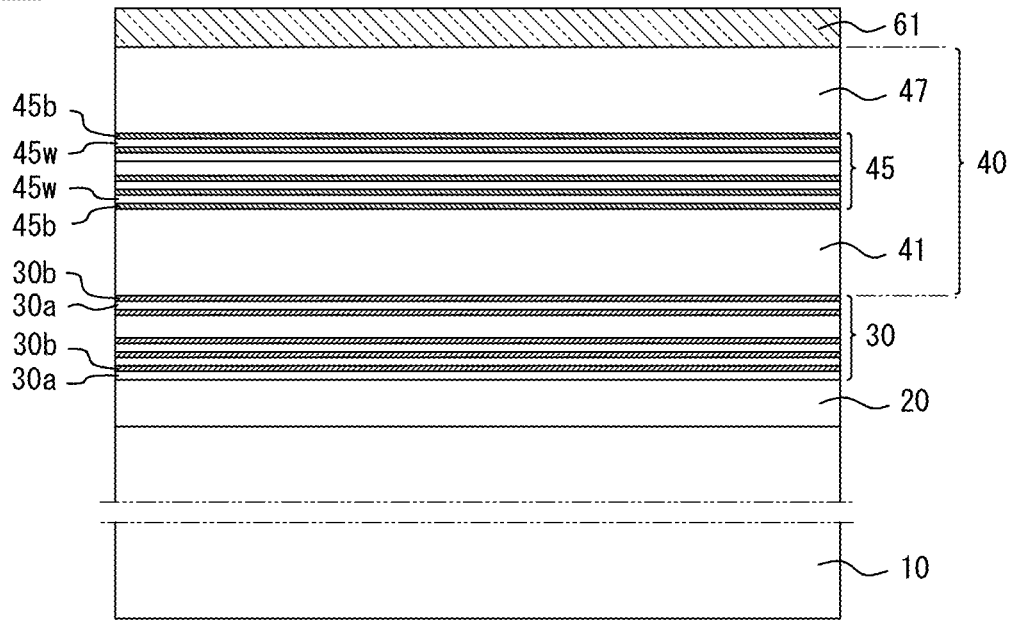
FIG. 3 is a schematic cross-sectional view illustrating a step of the example of a production process of a semiconductor light-emitting element of this disclosure, subsequent to the steps in FIG. 2.
Figure 3:
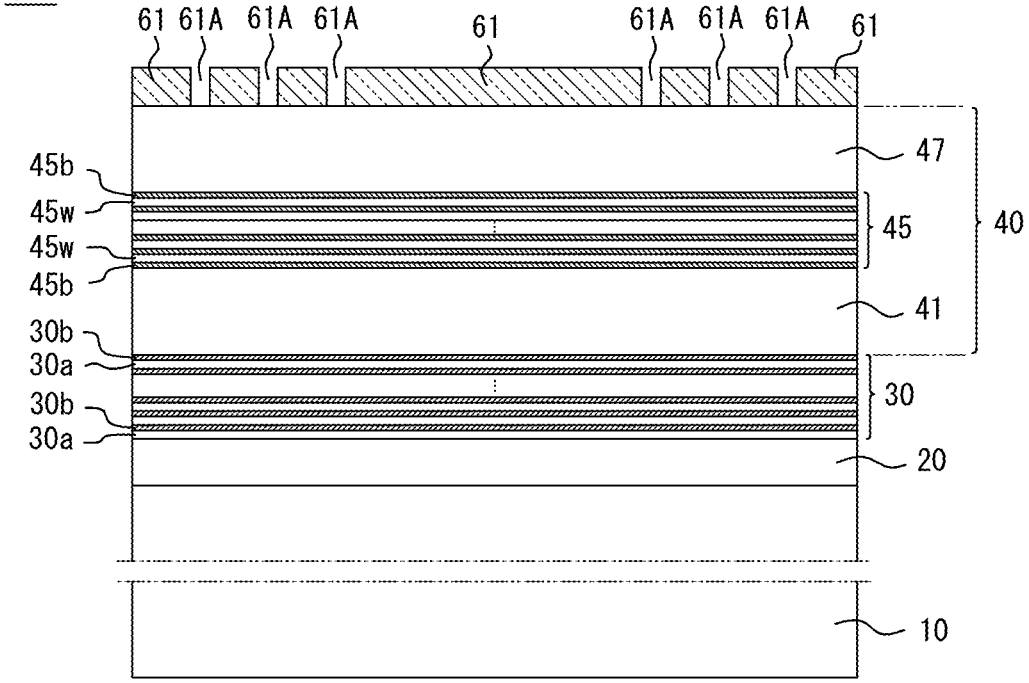

First, the transparent insulating layer 61 may be deposited on the semiconductor laminate 40 (S40 in FIG. 3). For the method of deposition, a known technique such as plasma CVD or sputtering can be used. After that, a resist pattern is formed on the transparent insulating layer 61 using a photomask. Next, the transparent insulating layer 61 is partly removed by etching using the resist pattern to form the through holes 61A (A50 in FIG. 3). The provision of the through holes 61A exposes part of the outermost surface of the semiconductor laminate 40. After that, the ohmic electrode portions 65 are formed by deposition over a resist pattern and subsequent lift-off using the resist pattern, thus the distribution portion 60 can be formed (S60 in FIG. 4). In the distribution portion 60, parts of the transparent insulating layer 61 and the ohmic electrode portions 65 are arranged in parallel. Note that the same resist pattern may be used in etching the transparent insulating layer 61 and in the lift-off for the ohmic electrode portions 65; alternatively, a different resist pattern may be formed. It should be noted that in the drawings, the ohmic electrode portions fill the through holes 61A for convenience of illustration; however, this is not restrictive. Although not illustrated, gaps may be formed between the transparent insulating layer 61 and the ohmic electrode portions because etching using a combination of resist patterns or a resist pattern propagates to areas covered with the resist pattern(s), and that is acceptable.

The ohmic electrode portions 65 can be formed into islands distributed in a predetermined pattern. Referring to S110 in FIG. 6 to be described, for the numerals, the ohmic electrode portions 65 are preferably placed to be aligned so that the n-type electrode 91 is not placed in the vertically upward direction of the ohmic electrode portions 65. For example, Au, AuZn, AuBe, AuTi, etc. can be used as the ohmic electrode portions 65, and a structure in which those materials are stacked can preferably be used as the ohmic electrode portions 65. For example, Ti/Au may be used as the ohmic electrode portions 65. The thickness (or the total thickness) of the ohmic electrode portions 65 may be for example, but not limited to 300 nm to 1300 nm, preferably 350 nm to 800 nm.

Although not illustrated, the relation between the thickness $H_1$ of the transparent insulating layer 61 and the thickness $H_2$ of the ohmic electrode portions 65 may be $H_1 \geq H_2$ or may be $H_1 > H_2$. Under these conditions, the thickness of the transparent insulating layer 61 may be for example, but not limited to, 360 nm to 1600 nm, more preferably 410 nm to 1100 nm. Further, it is also preferred that the difference between the thickness $H_1$ of the transparent insulating layer 61 and the thickness $H_2$ of the ohmic electrode portions 65: $H_1$-$H_2$ is 10 nm or more and 100 nm or less. Moreover, when contact layers are additionally provided as described above, a contact layer may be formed to remain only in the through holes 61A, in which case, the total thickness of the contact layer and the ohmic electrode portions may be the thickness $H_2$.

Further, the transparent insulating layer 61 may use $SiO_2$, SiN, ITO, $Al_2O_3$, AlN, etc.; and the transparent insulating layer 61 is preferably made of $SiO_2$ in particular. $SiO_2$ can easily be treated by etching using for example BHF.

Reflective Layer Formation Step

As illustrated in S70, the reflective layer 71 is formed on the p-type cladding layer 47 (when the distribution portion 60 is provided, on the distribution portion 60). The reflective layer 71 may have a DBR structure, and may be made of reflective metals. When the reflective layer 71 is made of metal materials, the composition preferably includes 50 mass % or more Au. More preferably, Au in the composition is 80 mass % or more. The reflective layer 71 may include a plurality of metal layers, and as metals forming the reflective layer 71, Al, Pt, Ti, Ag, etc. may be used in addition to Au. For example, the reflective layer 71 may be constituted by a single layer made of Au alone; alternatively, the reflective layer 71 may include two or more Au metal layers. To ensure to perform bonding in the subsequent bonding step, the outermost surface layer of the reflective layer 71 (the surface opposite to the semiconductor laminate 40) is preferably an Au metal layer.

Figure 4:
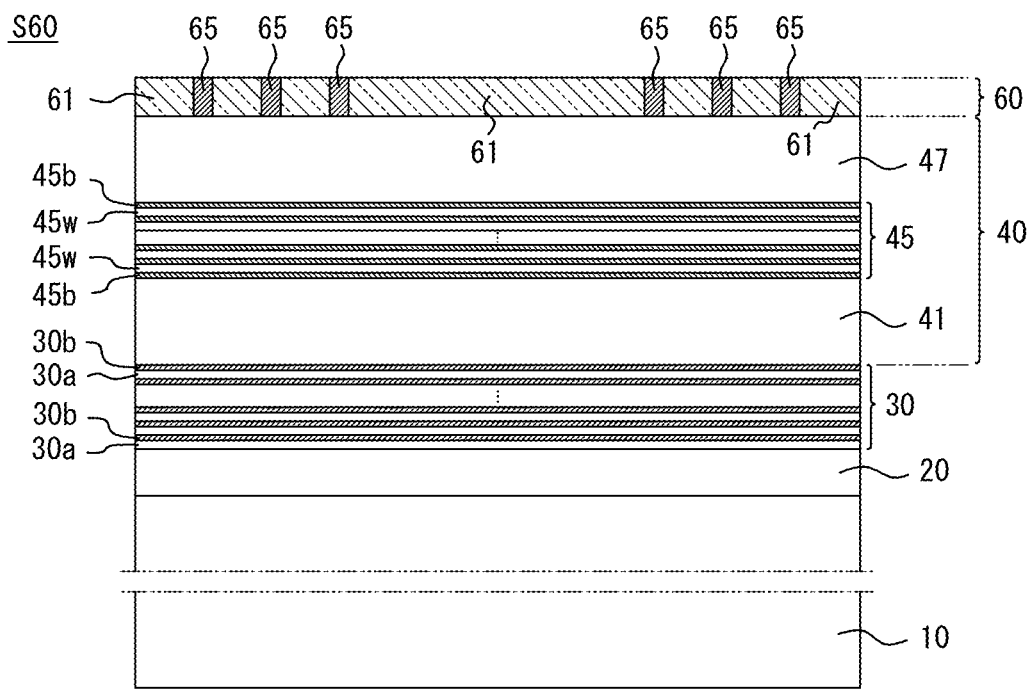
FIG. 4 is a schematic cross-sectional view illustrating steps of the example of a production process of a semiconductor light-emitting element of this disclosure, subsequent to the steps in FIG. 3.
Figure 4:
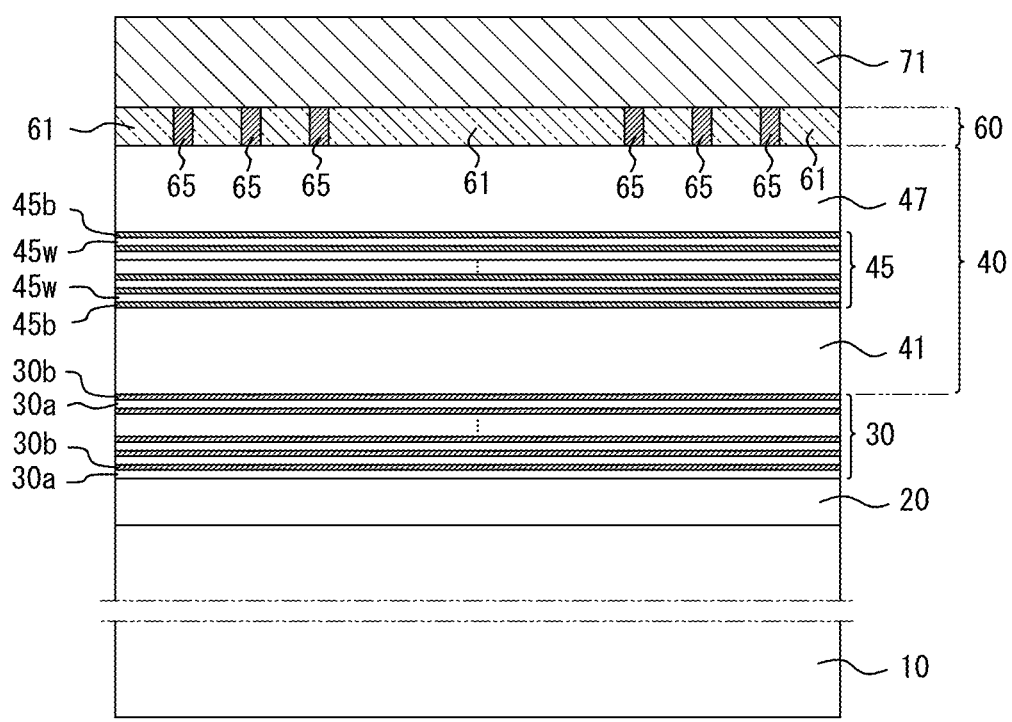

Referring to S70 in FIG. 4, for example metal layers of Al, Au, Pt, and Au may be formed in this order on the distribution portion 60 (also the above gaps if the gasps are formed), thereby forming the reflective layer 71. The thickness of one Au metal layer in the reflective layer 71 may be for example 400 nm to 2000 nm, and the thickness of each metal layer made of a metal other than Au may be for example 5 nm to 200 nm. The reflective layer 71 can be formed by deposition using a typical technique such as vapor deposition.

Bonding Step

Figure 5:
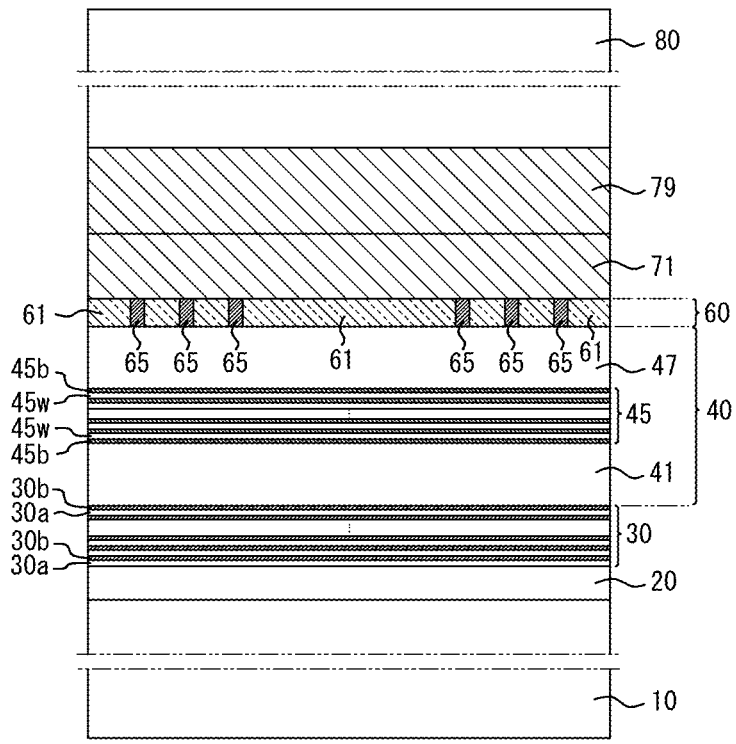
FIG. 5 is a schematic cross-sectional view illustrating steps of the example of a production process of a semiconductor light-emitting element of this disclosure, subsequent to the steps in FIG. 4.
Figure 5:
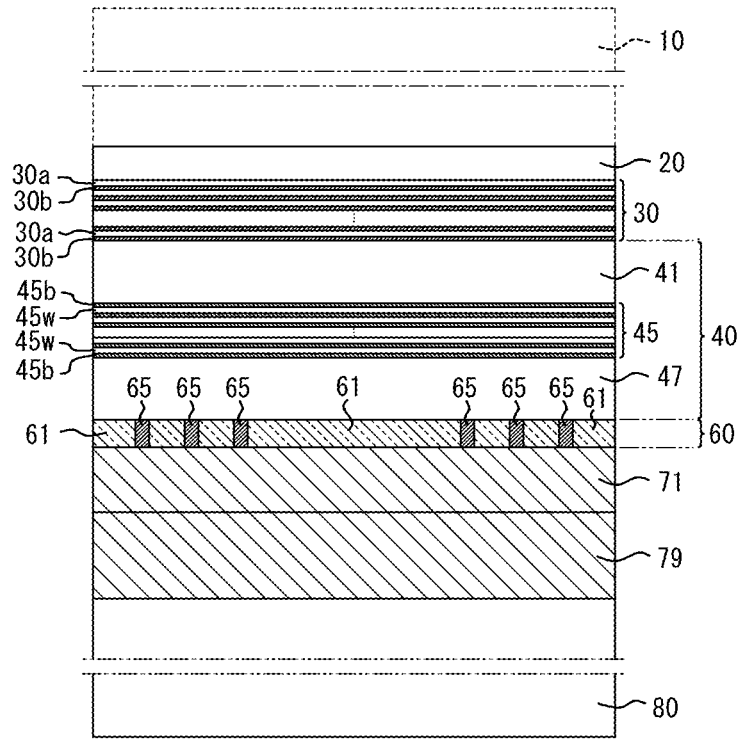

Reference is made to S80 in FIG. 5. In the bonding step, the reflective layer 71 having been formed is bonded to the support substrate 80 with at least a metal bonding layer 79 therebetween. Prior to this bonding step, the metal bonding layer 79 is previously formed on a surface of the support substrate 80 by sputtering, vapor deposition, etc. For example, the metal bonding layer 79 and the reflective layer 71 are placed to face each other and put together, followed by bonding of the layers by thermocompression bonding at a temperature of approximately 250° C. to 500° C.

Metal Bonding Layer

Metals such as Ti, Pt, and Au; and metals forming a eutectic alloy with gold (for example, Sn) may be used to form the metal bonding layer 79. Layers of such metals are preferably stacked to form the metal bonding layer 79. For example, Ti with a thickness of 400 nm to 800 nm, Pt with a thickness of 5 nm to 20 nm, and Au with a thickness of 700 nm to 1200 nm can be stacked in this order on the surface of the support substrate 80 to form the metal bonding layer 79. Note that when the reflective layer 71 and the metal bonding layer 79 are bonded together, to ensure to perform bonding, an Au metal layer is provided as the outermost surface layer of the metal bonding layer 79, and Au is also provided as the outermost surface layer of the reflective layer 71 to perform bonding of Au and Au by Au—Au diffusion bonding.

Support Substrate

The support substrate 80 is a substrate made of a different material from the growth substrate 10; for example, a submount substrate based on a ceramic substrate of AlN etc. other than a semiconductor substrate of Si, Ge etc. or a metal substrate of Mo, Cu—W, etc., can be used. Since the above-described bonding process is used, the support substrate 80 is allowed to have a lattice mismatch with the semiconductor layers formed. Further, although the support substrate 80 may be insulating depending on use, it is preferably a conductive substrate. In terms of workability and cost, a Si substrate is preferably used as the support substrate 80. The use of a Si substrate can significantly reduce the thickness of the support substrate 80 compared with that of conventional support substrates, and such a substrate is suitable for packaging in combination with various semiconductor devices. Further, a Si substrate is also more advantageous than an InAs substrate also in terms of heat dissipation.

Substrate Removal Step

Reference is made to S90 in FIG. 5. In the substrate removal step, the growth substrate 10 is removed. Note that "remove" here does not necessarily mean to "completely remove" the growth substrate 10. The growth substrate 10 is tolerated to remain partly as long as the etching stop layer 30 is exposed by the "removal" in this step and the growth substrate 10 can be removed together with the etching stop layer 30. When an InAs substrate is used as the growth substrate 10, the growth substrate 10 may be removed using the etching stop layer 30 by etching the growth substrate 10 with concentrated hydrochloric acid alone or using an etchant other than concentrated hydrochloric acid before the stage of the exposure of the etching stop layer 30. InAs can be etched using for example a hydrochloric acid-hydrogen peroxide mixture, a sulfuric acid-hydrogen peroxide mixture, etc. However, these etchants of mixed solutions cause etching of the etching stop layer 30 as well. Accordingly, etching is hardly stopped at a predetermined position using only the above mixed solutions. Thus, in the step of removing the growth substrate 10, etching is preferably performed using only concentrated hydrochloric acid in the final stage of the exposure of the etching stop layer 30. Further, part of InAs may be similarly removed by a method other than wet etching, for example, dry etching or machining such as grinding. The InAs substrate can be removed in the end by wet etching using concentrated hydrochloric acid of 8 M or higher (for example, 12 M concentrated hydrochloric acid), and the etching can be stopped at least by the etching stop layer 30. Since the etching stop layer 30 is made of a GaAsSb-based III-V compound semiconductor, it is not removed with concentrated hydrochloric acid. For example, the etching stop layer 30 can be removed by wet etching using an ammonia-hydrogen peroxide mixture.

Etching Conditions

As described above, when the growth substrate 10 is an InAs substrate, the growth substrate 10 can be wet etched using concentrated hydrochloric acid of 8 M or higher (for example, 12 M concentrated hydrochloric acid). However, the etching rate in this case is low, and the following etching conditions are preferably employed considering the productivity. For example, removing the InAs substrate in a short period of time by increasing the etching rate by maintaining the liquid temperature of the etchant of 12 M concentrated hydrochloric acid at 35° C. or higher is preferred in terms of the productivity. Further, it is also preferred that after removing the InAs substrate halfway using an etchant that allows for isotropic flat etching at a high etching rate (for example, a sulfuric acid-hydrogen peroxide mixture), the InAs substrate is completely removed using concentrated hydrochloric acid having etching selectivity in the final stage of the exposure of the etching stop layer 30.

Initial Buffer Layer Removal Step and Etching Stop Layer Removal Step

Referring to S100 in FIG. 6, in the case where the initial buffer layer 20 is provided, the initial buffer layer 20 can be removed using etching conditions appropriate for the semiconductor composition of the layer. In the case where the initial buffer layer 20 is made of InAs, the initial buffer layer 20 is removed together with the growth substrate 10. The etching stop layer 30 may then be removed.

Surface Roughening Step

In the surface roughening step, surface roughening is performed so that the arithmetic mean roughness Ra of the surface of the light extraction surface of the n-type cladding layer 41 is 0.07 μm or more and 0.7 μm or less, and the skewness Rsk of the surface is a positive value. The surface roughening may be performed so that the rough pattern of the surface of the light extraction surface forms a random rough surface. Referring to S110 in FIGS. 6 and S120 in FIG. 7, the surface roughening step is described.

Figure 7:
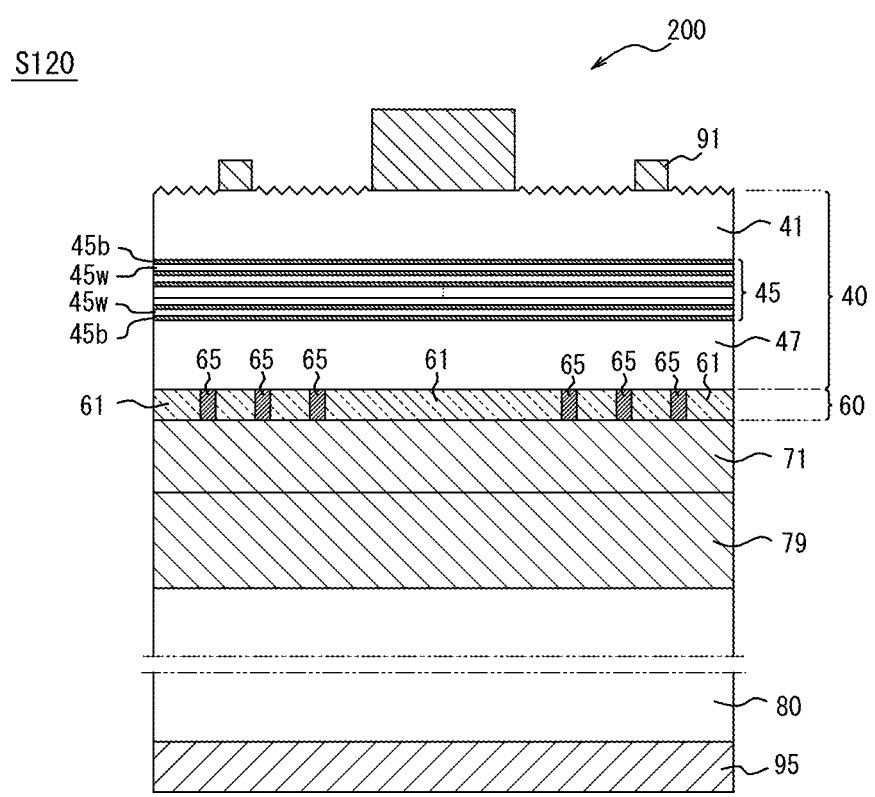
FIG. 7 is a schematic cross-sectional view illustrating a step of the example of a production process of a semiconductor light-emitting element of this disclosure, subsequent to the steps in FIG. 6.

First, when the n-type electrode 91 is formed by sputtering, electron beam vapor deposition, resistance heating, etc. after forming a photo resist or the like on the n-type cladding layer 41, this n-type electrode 91 can be used as a mask for performing surface roughening on the n-type cladding layer 41. Since an area in the surface of the n-type cladding layer 41 other than the area on which the n-type electrode 91 is formed serves as the light extraction surface of the n-type cladding layer 41, the light extraction surface is roughened for example by etching. An etchant used preferably uses nitric acid. The nitric acid used for surface roughening preferably uses nitric acid with a concentration of 11 M to 20 M (mol/L), more preferably uses nitric acid with a concentration of 12 M to 16 M (mol/L). Nitric acid with a concentration of less than 11 M would result in a high etching rate, causing the etched surface to be nearly flat, and concentrated nitric acid with a concentration of 21 M or more would result in an excessively low etching rate, causing roughening to take time. Further, the liquid temperature of the nitric acid is preferably in a range of 5° C. to 30° C. The etching time may be an appropriate etching time selected depending on the concentration and the liquid temperature; for example, surface roughening of the n-type cladding layer 41 can be performed by immersing a whole wafer for 5 s to 60 s. The degree of surface roughening may be adjusted by controlling the retention temperature and the concentration of the etchant so that the above conditions are met. Although S120 in FIG. 7 is illustrated in a schematic view in which only the upper surface of the n-type cladding layer 41 is roughened, the side surfaces of the n-type cladding layer 41 are also preferably roughened by adding a step of etching away or cutting part of the semiconductor laminate (for example, positions to be cut by dicing) before the surface roughening. Thus, the semiconductor light-emitting element 200 can be produced. In performing surface roughening, before the immersion in the etchant, a protective film for temporarily covering the n-type electrode 91 may be formed. The protective film for covering the n-type electrode 91 may use, for example, a resist that is easily formed temporarily and easily removed, and the protective film is preferably formed with the minimum area that covers the upper surface and the side surfaces of the n-type electrode 91. When the etching amount of a joint portion between the n-type cladding layer 41 and the n-type electrode 91 is large in surface roughening, the n-type electrode 91 would be detached; thus, forming a temporary protective film is useful in preventing the n-type electrode 91 from being detached when Ra is high.

The semiconductor light-emitting element 200 thus produced includes the support substrate 80, the metal bonding layer 79 on the support substrate 80, the reflective layer 71 on the metal bonding layer 79, the p-type cladding layer 47 on the reflective layer 71, the active layer 45 on the p-type cladding layer 47, the n-type cladding layer 41 on the active layer 45; and the n-type cladding layer 41 is on the light extraction side. The arithmetic mean roughness Ra of the surface of the light extraction surface of the n-type cladding layer 41 is 0.07 μm or more and 0.7 μm or less, and the skewness Rsk of the surface is a positive value.

In the surface roughening step, to ensure to obtain the advantageous effect of this disclosure, it is also preferred that the surface roughening is performed so that the arithmetic average roughness Ra of the surface of the light extraction surface is 0.1 μm or more and 0.4 μm or less, and the skewness Rsk thereof is 0.1 or more and 0.7 or less.

Further, as illustrated in S120 in FIG. 7, a p-type electrode 95 may be provided on the rear surface of the support substrate 80. The formation of the p-type electrode 95 may be performed either before or after the surface roughening.

Protective Film Formation Step

Further, although not illustrated, after the surface roughening step, a protective film may be provided on the light extraction surface on the n-type cladding layer 41 in the production of a semiconductor light-emitting element. For the protective film, a known technique such as plasma CVD or sputtering can be used. The protective film may use $SiO_2$, SiN, ITO, AlN, or the like can be used. This is because the protective film is effective in enhancing light extraction by reducing the refractive index difference between the n-type cladding layer 41 and the air. Note that a protective film for protecting the side surfaces of the semiconductor laminate 40 may also be provided.

Although not illustrated, in another preferred structure, the etching stop layer 30 is used as a contact layer, and the etching stop layer 30 is left between the n-type cladding layer 41 and the n-type electrode 91.

In the above example of a method of producing the semiconductor light-emitting element 200, for convenience of description, the second conductivity type cladding layer 41 is described as the "n-type cladding layer 41" and the first conductivity type cladding layer 47 is described as the "p-type cladding layer 47"; however, it should be understood that the conductivity types of the n-type and p-type semiconductor layers formed on the growth substrate 10 may be reversed.

Further, in the above example of a production method, a method of producing a bonded semiconductor light-emitting element 200 has been described; however, the effect of the surface roughening conditions of this disclosure can also be applied to a non-bonded semiconductor light-emitting element. Referring to the numerals in FIG. 1 described above, a method of producing a non-bonded semiconductor light-emitting element, according to another example of this disclosure includes a first step of sequentially forming a reflective layer 75 having a DBR structure, a first conductivity type cladding layer 47 made of an InAsSbP-based III-V compound semiconductor containing at least In and As, an active layer 45 with a center emission wavelength of 3400 nm or more and 4500 nm or less, and a second conductivity type cladding layer 41 made of an InAsSbP-based III-V compound semiconductor containing at least In and As on a substrate 15; and a second step of performing surface roughening so that the arithmetic average roughness Ra of a surface of a light extraction surface of the second conductivity type cladding layer 41 is 0.07 μm or more and 0.7 μm or less, and the skewness Rsk of the surface is a positive value. The surface roughening may preferably be performed so that the rough pattern of the surface forms a random rough surface. To ensure to obtain the advantageous effect of this disclosure, in the second step, the surface roughening is preferably performed so that the arithmetic average roughness Ra of the surface of the light extraction surface is 0.1 μm or more and 0.4 μm or less, and the skewness Rsk thereof is 0.1 or more and 0.7 or less. Note that comparing the bonded element and the non-bonded element, the bonded element can exhibit higher light emission efficiency.

Moreover, referring similarly to the numerals in FIG. 1 as in the above description, a method of producing a non-bonded semiconductor light-emitting element, according to another example of this disclosure includes a first step of sequentially forming a reflective layer 75 having a DBR structure, a first conductivity type cladding layer 47 made of an InAsSbP-based III-V compound semiconductor containing at least In and As, an active layer 45 with a center emission wavelength of 3400 nm or more and 4500 nm or less, and a second conductivity type cladding layer 41 made of an InAsSbP-based III-V compound semiconductor containing at least In and As on a substrate 15; and a second step of performing surface roughening on a light extraction surface of the second conductivity type cladding layer 41 using nitric acid. Further, to ensure to obtain the advantageous effect of this disclosure, in this second step, the roughening is preferably performed using nitric acid with a concentration of 11 M to 20 M (mol/L). For the first step and the second step, the steps previously described are applicable, so the description of the details will not be repeated.

When surface roughening is performed using nitric acid on GaAs and AlGaAs used in a light-emitting element that emits light with a shorter wavelength than InAs, a rough surface having a negative skewness Rsk is obtained. Which etchant with which concentration can be suitably used for performing surface roughening on InAsSbP and InAs free of Al and Ga has not been known. The present inventors diligently studied surface roughening conditions (surface roughness Ra and skewness Rsk) for the second conductivity type cladding layer, and they found that a single peak can be obtained by controlling multi peaks in a light emission spectrum using nitric acid with the above concentration.

EXAMPLES

The following provides a more detailed description of this disclosure using examples. However, this disclosure is not in any way limited by the following examples.

Example 1

The following provides a more detailed description of this disclosure using examples. However, this disclosure is not in any way limited by the following examples. A semiconductor light-emitting element of Example 1 was fabricated in accordance with the process steps of a method of producing a bonded semiconductor light-emitting element illustrated in FIG. 2 to FIG. 7. The steps are specifically described below.

First, an undoped InAs layer (initial buffer layer) was formed to a thickness of 100 nm on the (100) plane of an undoped InAs substrate (substrate thickness: 475 μm). Next, a superlattice laminate (etching stop layer) in which 100 pairs of undoped GaSb layers (thickness: 0.9 nm) and $GaAs_{0.34}Sb_{0.66}$ layers (thickness: 0.1 nm) were stacked was formed. Subsequently, an undoped n-type InAs cladding layer (thickness: 3 μm), an active layer having a quantum well structure with a dominant emission wavelength of 4100 nm (total thickness: 1.6 μm), a p-type AlInAs electron blocking layer (thickness: 15 nm) doped with Zn, and a p-type InAs cladding layer (thickness: 1 μm) doped with Zn were sequentially formed on the superlattice laminate by MOCVD. Now, for the formation of the active layer having a quantum well structure, after forming an $InAs_{0.99}P_{0.01}$ barrier layer (thickness: 30 nm), 40 $InAs_{0.85}Sb_{0.15}$ well layers (thickness: 10 nm) and 40 $InAs_{0.15}P_{0.85}$ barrier layers (thickness: 30 nm) were alternately stacked to form 40.5 pairs of layers including the barrier layer formed first. Note that the InAs cladding layer grown as an undoped layer in Example 1 contained $1\times10^{16}$ atoms/cm$^3$ of Te and was n-type; accordingly, the layer is described as an "n-type InAs cladding layer" as above, and may also be described as an n-type cladding layer.

Next, a transparent insulating layer (thickness: 550 nm) made of $SiO_2$ was formed on the entire surface of the p-type InAs cladding layer by plasma CVD. A resist was formed thereon to have a pattern reversed from the electrode pattern of the n-type electrode in plan view (see FIG. 11A), and $SiO_2$ was partly removed by wet etching using BHF to form through holes, thus the p-type InAs cladding layer was exposed. Subsequently, p-type ohmic electrode portions (Ti/Au, total thickness: 540 nm) was formed in the through holes by vapor deposition and lift-off of the resist pattern so that parts of the transparent insulating layer and the p-type ohmic electrode portions were formed in parallel, thus a distribution portion (serving as a current spreading layer) was formed.

Next, on the entire surface of the distribution portion, a metal reflective layer (Al/Au/Pt/Au) was formed by vapor deposition. The thickness of the metal layers in the reflective metal layer was 10 nm, 650 nm, 100 nm, and 900 nm in this order.

On the other hand, a metal bonding layer (Ti/Pt/Au) was formed on a conductive Si substrate (substrate thickness: 200 μm) serving as a support substrate. The thickness of the metal layers in the metal bonding layer was 650 nm, 20 nm, and 900 nm in this order.

The metal reflective layer and the metal bonding layer were placed to face each other, and were subjected to thermocompression bonding at 300° C. The whole wafer was immersed in concentrated hydrochloric acid (produced by KANTO CHEMICAL CO., INC.) with a concentration of 12 M for 6 h so that at least the InAs substrate, the initial buffer layer, and the etching stop layer were immersed in the concentrated hydrochloric acid. Thus, the InAs substrate and the buffer layer were removed to expose the superlattice laminate (etching stop layer) including the GaSb layers and the $GaAs_{0.34}Sb_{0.66}$ layers. Subsequently, after cleaning with pure water and drying, the superlattice laminate (etching stop layer) was removed by wet etching using an ammonia-hydrogen peroxide mixture, thus the n-type InAs cladding layer was exposed.

Figure 11A:
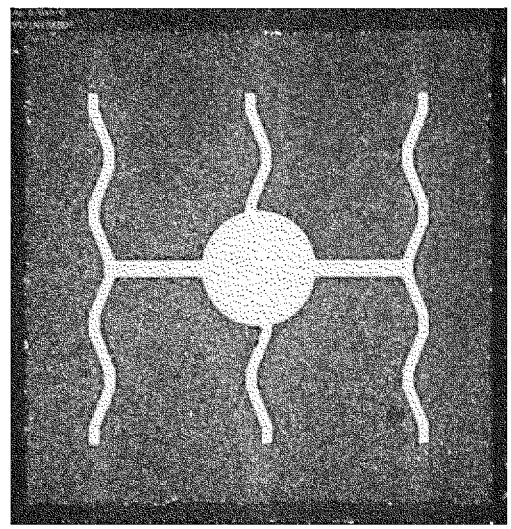
FIGS. 11A to 11C are surface images of semiconductor light-emitting elements fabricated in Example 1, Comparative Example 1, and Comparative Example 2.

Next, on the n-type InAs cladding layer, an n-type electrode (Ti (thickness: 150 nm)/Au (thickness: 1250 nm)) was formed in a pattern by forming a resist pattern, vapor depositing the n-type electrode materials, and lifting the resist pattern off. FIG. 11A presents a photograph of the n-type electrode having been subjected to surface roughening to be described below.

A bottom electrode (Ti (thickness: 10 nm)/Pt (thickness: 50 nm)/Au (thickness: 200 nm)) was formed on the rear surface side of the Si substrate, and alloying was performed by heat treatment at 300° C. for 1 min. After that, the whole wafer was immersed in a 13 M nitric acid (produced by KANTO CHEMICAL CO., INC.) solution maintained at 8° C. for 5 s, thereby performing surface roughening on the outermost surface of the n-type InAs cladding layer. Subsequently, the whole wafer was immersed in aqueous ammonia for 1 min, and was then washed with pure water for 2 min or more.

Finally, chip singulation was performed by dicing, thus a semiconductor light-emitting element of Example 1 was fabricated. Note that the chip size was 500 μm×500 μm. FIG. 11A presents a photograph of the n-type electrode and the surface of the n-type InAs cladding layer having been subjected to surface roughening.

Example 2

A semiconductor light-emitting element of Example 2 was fabricated in the same manner as in Example 1 except that the temperature of the nitric acid was 7° C. in the surface roughening after the alloying.

Example 3

In Example 3, the temperature of the nitric acid was changed to 10° C. in the surface roughening after the alloying. Further, a step of forming a resist pattern to cover the n-type electrode before the surface roughening to protect the electrode, and removing the resist protecting the electrode after the washing in the surface roughening was added. Aside from the above, a semiconductor light-emitting element of Example 3 was fabricated in the same manner as in Example 1.

Example 4

In Example 4, the temperature of the nitric acid was changed to 30° C. in the surface roughening after the alloying. Further, a step of forming a resist pattern to cover the n-type electrode before the surface roughening to protect the electrode, and removing the resist protecting the electrode after the washing in the surface roughening was added. Aside from the above, a semiconductor light-emitting element of Example 4 was fabricated in the same manner as in Example 1.

Comparative Example 1

Figure 11B:
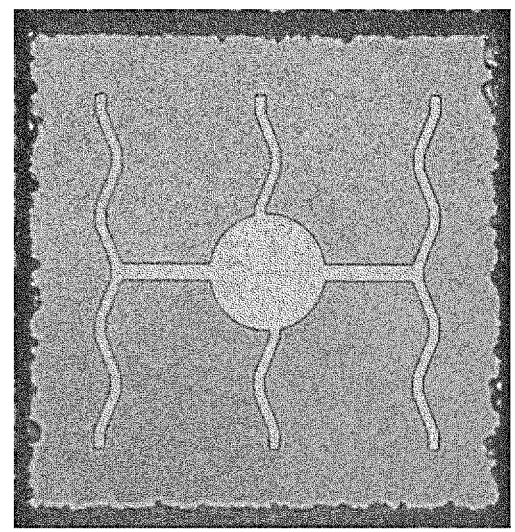

A semiconductor light-emitting element of Comparative Example 1 was fabricated in the same manner as in Example 1 except that the surface of the n-type InAs cladding layer was not subjected to surface roughening. FIG. 11B presents a photograph of the n-type electrode and the surface of the n-type InAs cladding layer.

Comparative Example 2

A semiconductor light-emitting element of Comparative Example 2 was fabricated in the same manner as in Example 1 except that surface roughening described below was performed. In Comparative Example 2, a rough pattern was formed on the surface of the n-type InAs cladding layer with reference to JP 2018-101675 A.

Figure 11C:
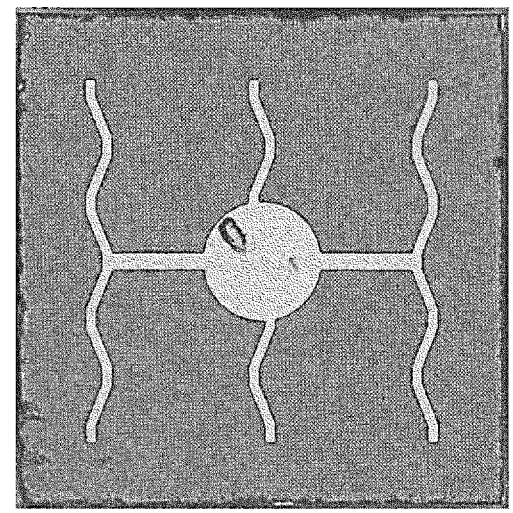

In Comparative Example 2, a regular pattern was formed on the surface of the n-type InAs cladding layer using a positive photo resist after the alloying. Subsequently, part of the n-type InAs cladding layer was etched using a mixed solution of phosphoric acid and a hydrogen peroxide solution (phosphoric acid:hydrogen peroxide solution=1:1) under shaking for 1 min. Thus, the rough pattern was formed. FIG. 11C presents a photograph of the n-type electrode and the surface of the n-type InAs cladding layer having been subjected to surface roughening.

Measurement of Roughness of Rough Surface

In Examples 1 to 4 and Comparative Examples 1 and 2, the rough surface profile of the surface of the n-type cladding layer of a chip (wafer after dicing) was measured after the surface roughening (surface roughening was not performed in Comparative Example 1) using a contact stylus step profilometer "P-6" manufactured by KLA-Tencor Corporation. The shape of the probe used had a stylus tip radius of 2 μm, the stylus contact force was 2 mg, the scanning rate was 2 μm/s, and the sampling frequency was 50 Hz. The measurement distance (reference length) was 200 μm. The value of the surface roughness Ra and the value of the skewness Rsk were automatically calculated by the step profilometer.

Figure 8A:
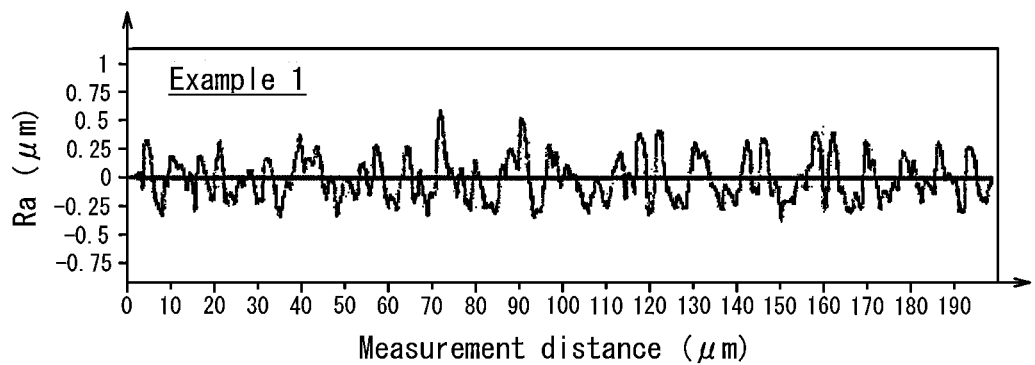
FIGS. 8A to 8C are graphs giving the rough surface profile obtained using a step profilometer in Example 1, Example 2, and Comparative Example 2.
Figure 8B:
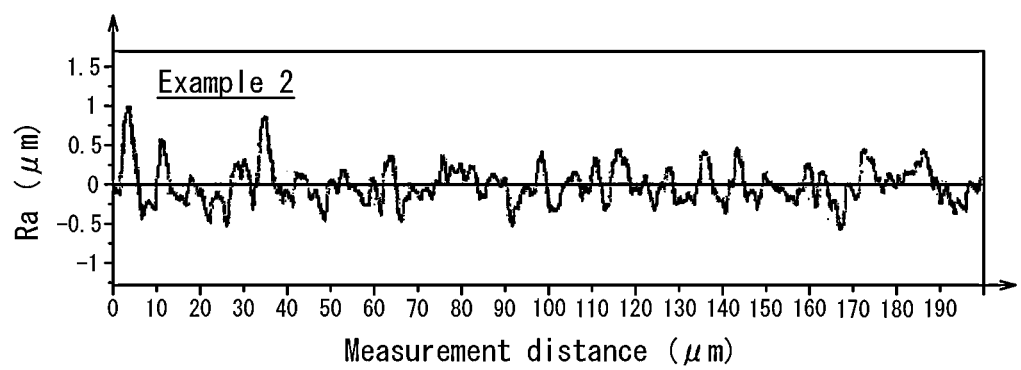
Figure 8C:
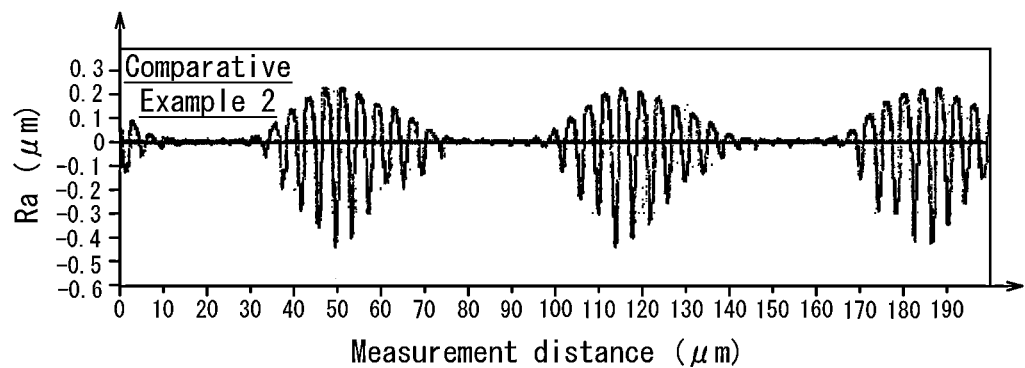

As representative examples, data obtained by the step profilometer in Examples 1, 2, and Comparative Example 2 are given in FIGS. 8A to 8C, respectively.

In both Examples 1 and 2, randomly shaped irregularities were formed, and the projections and recesses had a pointed end; on the other hand, since a pattern was formed in Comparative Example 2, the pitches between the irregularities were regular and the recesses had a great depth. Note that the surface was flat in Comparative Example 1 in which surface roughening was not performed. Amplitude parameters (Rp, Rv, Rz, Rc, Rt, Ra, Rq, Rsk, Rku) according to ISO 4287-1997 were automatically calculated in the data measurement by the step profilometer. Of them, Ra and Rsk are given in Table 1 below. Further, as seen in FIG. 8A and FIG. 8B, an area where grooves having regular pitches were not formed was not observed in the surface on the light extraction side in Examples 1 to 2 unlike in Comparative Example 2, so the surface was evaluated to be a "random rough surface".

TABLE 1

| | Surface roughness | | LED properties | | |
|---|---|---|---|---|---|
| | Ra (μm) | Rsk | Po [μW] | Vf [V] | Multi peaks |
| Comparative Example 1 | 0.002 | 0.865 | 68 | 0.349 | yes |
| Comparative Example 2 | 0.082 | −0.866 | 115 | 0.356 | yes |
| Example 1 | 0.155 | 0.497 | 167 | 0.401 | no |
| Example 2 | 0.152 | 0.247 | 172 | 0.408 | no |
| Example 3 | 0.357 | 0.466 | 268 | 0.418 | no |
| Example 4 | 0.573 | 0.355 | 244 | 0.449 | no |

Evaluation of Output and Vf

The semiconductor light-emitting element was mounted on a transistor outline header (TO-18) using silver paste and the top electrode was bonded using a gold wire, in Examples 1 to 4 and Comparative Examples 1 and 2. The light output power (Po) and the forward voltage (Vf) were measured while a current of 300 mA was flown in Examples and Comparative Examples. Note that the measurement of the light output power (Po) was performed using an integrating sphere. Further, the forward voltage (Vf) was the value of the voltage of a constant current device (model: 6243 manufactured by ADC CORPORATION) when a current of 300 mA was flown. The average of three values measured in each case is given in Table 1.

Evaluation of Light Emission Spectrum

The light emission spectrum for wavelengths of 2000 nm to 6000 nm of the semiconductor light-emitting element was measured using an FT-IR interferometer (model: FTIR-OEM000-ZNSE-USB, detector: FTIR-OEM000-060-2TE) manufactured by ARCoptix S.A while a current of 300 mA was flown in Examples 1 to 4 and Comparative Examples 1 and 2. The wavelength intervals in the light emission spectrum measurement for 2000 nm to 6000 nm were in a range of 1.6 nm to 14.6 nm.

The light emission spectrum measured was evaluated based on the following criteria. For a light emission spectrum where the vertical axis (emission intensity) represents the relative intensity having a maximum intensity of 1 on the linear scale, when any mission peak (maximal value obtained when the slope was 0) other than the emission peak at the center wavelength where the emission intensity was maximized in the light emission spectrum was found in a wavelength range in which the relative intensity of the emission intensity was 0.1 or more, it was determined that the spectrum had multi peaks. When no emission peak other than the emission peak at the center wavelength was found and a single peak was found, it was determined that the spectrum did not have multi peaks.

Figure 9A:
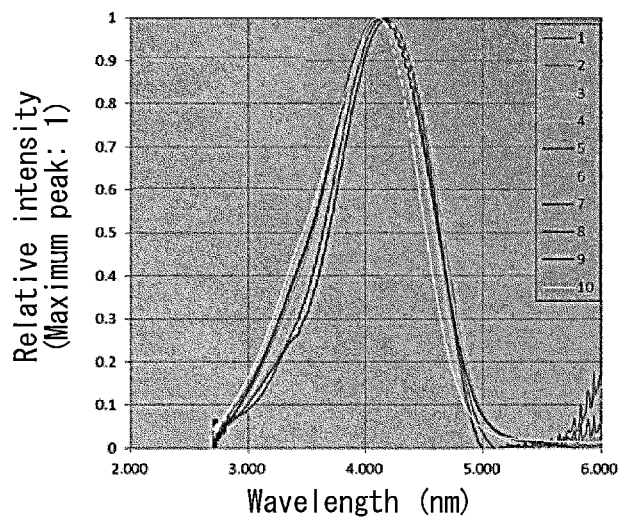
FIG. 9A to 9C are emission spectra obtained in Example 1, Comparative Example 1, and Comparative Example 2.
Figure 9B:
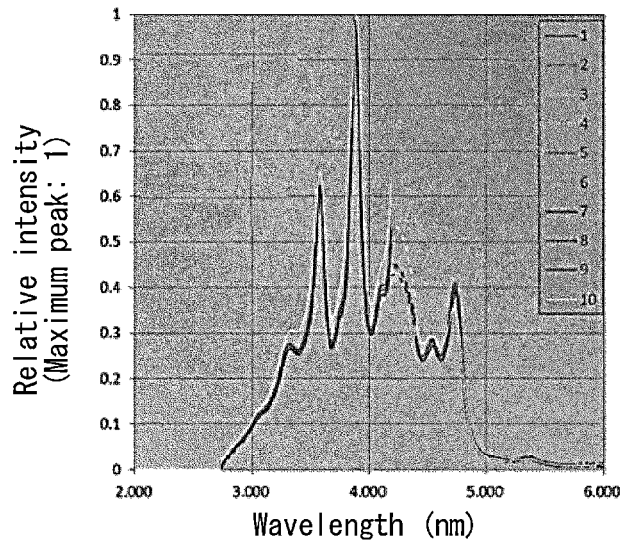
Figure 9C:
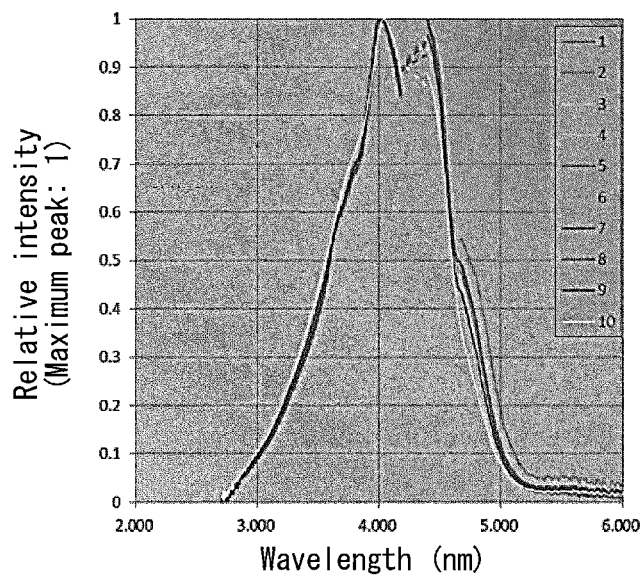

As representative examples, the light emission spectra in Example 1, Comparative Example 1, and Comparative Example 2 are given in FIGS. 9A to 9C, respectively. Further, the emission peak wavelength (λp) in Example 1 was 4150 nm. The light emission spectrum in Example 2 was almost the same as that in Example 1.

The results given in Table 1 and FIGS. 9A to 9C demonstrate that when the shape of irregularities in the surface of the light extraction surface of the semiconductor light-emitting element and the surface parameters met the conditions according to this disclosure as in Examples 1 to 4, the light emission spectrum did not have multi peaks and had a single peak.

Further, comparing Example 1 and Example 3, a higher surface roughness Ra is likely to have resulted in a higher light output power; on the other hand, in Example 4 where the surface roughness Ra was higher than 0.4, there was a tendency for the value of Vf to increase due to an effect on the spread of currents in the transverse direction.

For Examples 1 to 4 and Comparative Examples 1 and 2, the three-dimensional information of the roughness of the rough surface was acquired as described below.

3D Measurement of Roughness of Rough Surface

The rough surface profile of the surface of the n-type cladding layer in the chip (wafer after dicing) was measured after the surface roughening (surface roughening was not performed in Comparative Example 1) using a laser microscope for shape analysis (VK-X1000/1100 manufactured by KEYENCE CORPORATION). The lens magnification was 150x, and the number of pixels was 2048×1536.

Figure 10A:
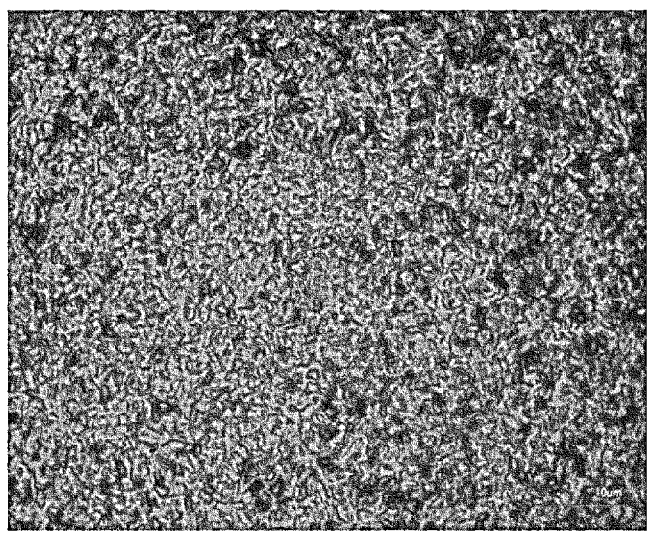
FIGS. 10A to 10C are micrographs of three-dimensional rough surface profiles obtained using a laser microscope for shape analysis in Example 1, Example 2, and Comparative Example 2.
Figure 10B:
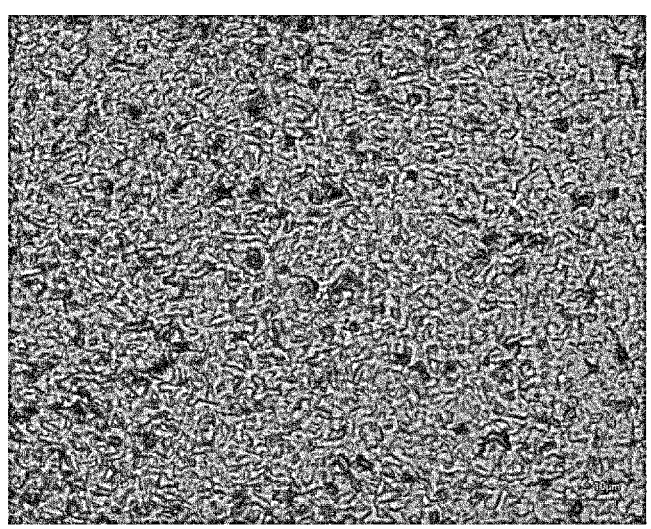
Figure 10C:
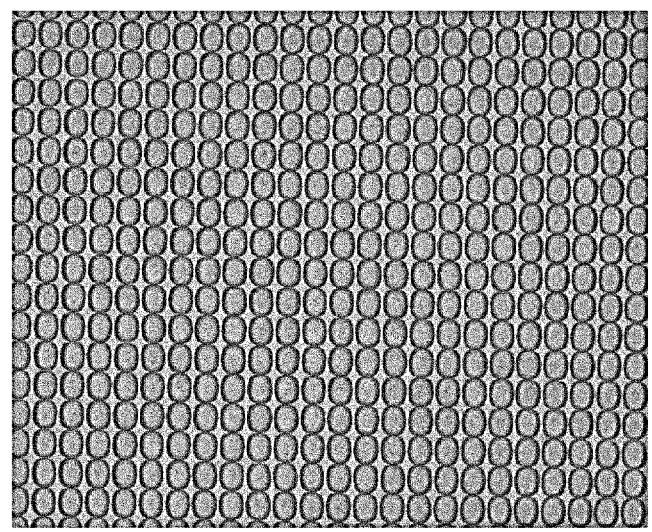

In the measurement for obtaining data, surface roughness parameters (Sa, Sz, Str, Spc, Sdr, Ssk, etc.) according to ISO 25178 were automatically calculated. The values of the parameters are given in Table 2 below. Further, as representative examples, micrographs of the surface of the n-type cladding layer after surface roughening in Examples 1, 2, and Comparative Example 2 are given in FIGS. 10A to 10C, respectively. As given in FIG. 10A and FIG. 10B, it was observed that a random rough surface had been formed in the surface of the n-type cladding layer in Example 1. On the other hand, as given in FIG. 10C, it was found that in the surface of the n-type cladding layer in Comparative Example 2, flat pattern portions (Ra: 0.010 μm or less) and grooves were arranged in a certain pattern, and the surface was not a random rough surface.

TABLE 2

| | Sa (μm) | Sz (μm) | Str | Spc (1/mm) | Sdr | Ssk |
|---|---|---|---|---|---|---|
| Comparative Example 1 | 0.005 | 0.081 | 0.624 | 253.75 | 0.000367 | −0.071 |
| Comparative Example 2 | 0.313 | 1.651 | 0.038 | 27941 | 0.7647 | 0.883 |
| Example 1 | 0.206 | 3.002 | 0.776 | 53942 | 1.08 | 0.012 |
| Example 2 | 0.203 | 2.842 | 0.765 | 44065 | 0.8684 | 0.402 |
| Example 3 | 0.363 | 4.463 | 0.586 | 12444 | 1.377 | 0.675 |
| Example 4 | 0.566 | 5.946 | 0.867 | 17033 | 1.894 | 0.332 |

INDUSTRIAL APPLICABILITY

This disclosure provides a semiconductor light-emitting element including a cladding layer made of an InAsSbP-based III-V compound semiconductor containing at least In and As that exhibits a light emission spectrum in which a single peak is obtained by controlling multi peaks, and to provide a method of producing the semiconductor light-emitting element.

REFERENCE SIGNS LIST

10: Growth substrate
15: Substrate
20: Initial buffer layer
30: Etching stop layer 41: Second conductivity type (n-type) cladding layer
45: Active layer
45w: Well layer
45b: Barrier layer
47: First conductivity type (p-type) cladding layer
60: Distribution portion
61: Transparent insulating layer
61A: Through hole
65: Ohmic electrode portion
71: Reflective layer
75: Reflective layer
79: Metal bonding layer
80: Support substrate
91: Top (n-type) electrode
95: Bottom (p-type) electrode
99: Protective film
100: Semiconductor light-emitting element
200: Semiconductor light-emitting element

The invention claimed is:

1. A semiconductor light-emitting element comprising:
a substrate;
a reflective layer on the substrate;
a first conductivity type cladding layer made of an InAsSbP-based III-V compound semiconductor containing at least In and As on the reflective layer;
an active layer with a center emission wavelength of 3400 nm or more and 4500 nm or less on the first conductivity type cladding layer; and
a second conductivity type cladding layer made of an InAsSbP-based III-V compound semiconductor containing at least In and As on the active layer,
wherein the second conductivity type cladding layer is on the light extraction side, and
an arithmetic average roughness Ra of a surface of a light extraction surface of the second conductivity type cladding layer is 0.07 μm or more and 0.7 μm or less, and a skewness Rsk of the surface is a positive value.

2. A semiconductor light-emitting element comprising:
a support substrate;
a metal bonding layer on the support substrate;
a reflective layer on the metal bonding layer;
a first conductivity type cladding layer made of an InAsSbP-based III-V compound semiconductor containing at least In and As on the reflective layer;
an active layer with a center emission wavelength of 3400 nm or more and 4500 nm or less on the first conductivity type cladding layer; and
a second conductivity type cladding layer made of an InAsSbP-based III-V compound semiconductor containing at least In and As on the active layer,
wherein the second conductivity type cladding layer is on the light extraction side, and
an arithmetic average roughness Ra of a surface of a light extraction surface of the second conductivity type cladding layer is 0.07 μm or more and 0.7 μm or less, and a skewness Rsk of the surface is a positive value.

3. The semiconductor light-emitting element according to claim 1, wherein a light emission spectrum of light obtained from the light extraction surface has a single peak.

4. The semiconductor light-emitting element according to claims 1, wherein the arithmetic average roughness Ra of the surface of the light extraction surface is 0.1 μm or more and 0.4 μm or less, and the skewness Rsk of the surface is 0.1 or more and 0.7 or less.

5. The semiconductor light-emitting element according to claims 1, wherein a protective film is provided on the light extraction surface.

* * * * *